US011711634B2

United States Patent
Zhu

(10) Patent No.: US 11,711,634 B2
(45) Date of Patent: Jul. 25, 2023

(54) ELECTRONIC CIRCUIT, SOLID-STATE IMAGE SENSOR, AND METHOD OF CONTROLLING ELECTRONIC CIRCUIT

(71) Applicant: SONY SEMICONDUCTOR SOLUTIONS CORPORATION, Kanagawa (JP)

(72) Inventor: Hongbo Zhu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 158 days.

(21) Appl. No.: 17/287,303

(22) PCT Filed: Sep. 18, 2019

(86) PCT No.: PCT/JP2019/036628
§ 371 (c)(1),
(2) Date: Apr. 21, 2021

(87) PCT Pub. No.: WO2020/090272
PCT Pub. Date: May 7, 2020

(65) Prior Publication Data
US 2021/0360182 A1  Nov. 18, 2021

(30) Foreign Application Priority Data
Oct. 30, 2018 (JP) ................................ 2018-203420

(51) Int. Cl.
*H04N 25/76* (2023.01)
*G06G 7/18* (2006.01)
(Continued)

(52) U.S. Cl.
CPC ............. *H04N 25/76* (2023.01); *G06G 7/18* (2013.01); *H04N 25/40* (2023.01); *H04N 25/60* (2023.01)

(58) Field of Classification Search
CPC ........ H04N 25/76; H04N 25/40; H04N 25/60; H04N 25/77; H04N 25/65; H04N 25/707;
(Continued)

(56) References Cited

U.S. PATENT DOCUMENTS 7,728,269 B2\* 6/2010 Lichtsteiner ........... H04N 25/76
250/208.1
8,576,317 B2\* 11/2013 Sakakibara ............ H04N 25/57
348/308
(Continued)

FOREIGN PATENT DOCUMENTS

| CN | 102209210 A | 10/2011 |
|---|---|---|
| JP | 2009-508085 A | 2/2009 |

(Continued)

OTHER PUBLICATIONS

International Search Report and Written Opinion of PCT Application No. PCT/JP2019/036628, dated Nov. 26, 2019, 09 pages of ISRWO.

(Continued)

*Primary Examiner* — Marly S Camargo
(74) *Attorney, Agent, or Firm* — Chip Law Group

(57) ABSTRACT

To suppress voltage variations due to transistor switching noise in a solid-state image sensor including a transistor that initializes a differentiating circuit.

A capacitance supplies a charge corresponding to an amount of variation in a predetermined pixel voltage to a predetermined input terminal. A voltage output unit outputs, as an output voltage, a voltage corresponding to an input voltage at the input terminal from a predetermined output terminal. A reset transistor supplies one of a positive charge or a negative charge during a predetermined period to control the output voltage to an initial value in a case where initializa-
(Continued)

tion is instructed. A charge supply unit supplies the other of the positive charge or the negative charge when the predetermined period elapses.

13 Claims, 29 Drawing Sheets

(51) Int. Cl.
*H04N 25/40* (2023.01)
*H04N 25/60* (2023.01)
*H03F 3/08* (2006.01)
*H03F 3/45* (2006.01)
*H04N 25/78* (2023.01)

(58) Field of Classification Search
CPC .... H04N 25/702; H04N 25/703; H04N 25/75; H04N 25/78; G06G 7/18; H03F 3/082; H03F 3/43; H03F 3/45
See application file for complete search history.

(56) References Cited

U.S. PATENT DOCUMENTS

| | | | |
|---|---|---|---|
| 10,161,789 B2* | 12/2018 | Suh | H04N 25/77 |
| 2005/0231621 A1 | 10/2005 | Su | |
| 2008/0135731 A1 | 6/2008 | Lichtsteiner et al. | |
| 2009/0190018 A1 | 7/2009 | Sakakibara | |
| 2010/0182468 A1 | 7/2010 | Posch et al. | |
| 2011/0242381 A1 | 10/2011 | Masaki et al. | |
| 2014/0036123 A1 | 2/2014 | Masaki et al. | |
| 2015/0138414 A1 | 5/2015 | Masaki et al. | |
| 2015/0237278 A1 | 8/2015 | Masaki et al. | |
| 2015/0319369 A1 | 11/2015 | Serrano Gotarredona et al. | |
| 2016/0065871 A1 | 3/2016 | Masaki et al. | |
| 2016/0094794 A1 | 3/2016 | Masaki et al. | |
| 2017/0059399 A1 | 3/2017 | Suh et al. | |
| 2017/0359531 A1 | 12/2017 | Masaki et al. | |
| 2018/0249098 A1 | 8/2018 | Masaki et al. | |
| 2020/0035897 A1* | 11/2020 | Niwa | H04N 24/772 |
| 2022/0255536 A1* | 8/2022 | Thottahil | H03F 3/012 |
| 2023/0008577 A1* | 1/2023 | Niwa | H04N 25/75 |

FOREIGN PATENT DOCUMENTS

| | | |
|---|---|---|
| JP | 2010-510732 A | 4/2010 |
| JP | 2011-229120 A | 11/2011 |
| JP | 2016-501495 A | 1/2016 |
| JP | 2016-533140 A | 10/2016 |
| JP | 2017-050853 A | 3/2017 |
| KR | 10-2011-0109891 A | 10/2011 |
| KR | 10-2016-0110322 A | 9/2016 |
| KR | 10-2016-0138933 A | 12/2016 |
| TW | 201143417 A | 12/2011 |
| TW | 201601540 A | 1/2016 |
| TW | 201720138 A | 6/2017 |

OTHER PUBLICATIONS

Lichtsteiner, et al., "A 128x128 120dB 15ps Latency Asynchronous Temporal Contrast Vision Sensor", IEEE Journal of Solid-State Circuits, vol. 43, No. 2, Jan. 31, 2008, pp. 566-576.
Lichtsteiner et al., "A 128x 128 120 dB 15 us Latency Asynchronous Temporal Contrast Vision Sensor", IEEE journal of solid-state circuits, IEEE, USA, vol. 43, No. 2. Feb. 1, 2008, pp. 566-576.
Extended European Search Report of EP Application No. 19878858. 0, dated Nov. 15, 2021, 11 pages.

* cited by examiner

ELECTRONIC CIRCUIT, SOLID-STATE IMAGE SENSOR, AND METHOD OF CONTROLLING ELECTRONIC CIRCUIT

CROSS REFERENCE TO RELATED APPLICATIONS

This application is a U.S. National Phase of International Patent Application No. PCT/JP2019/036628 filed on Sep. 18, 2019, which claims priority benefit of Japanese Patent Application No. JP 2018-203420 filed in the Japan Patent Office on Oct. 30, 2018. Each of the above-referenced applications is hereby incorporated herein by reference in its entirety.

TECHNICAL FIELD

The present technology relates to an electronic circuit, a solid-state image sensor, and a method of controlling the electronic circuit. More specifically, the present technology relates to an electronic circuit that calculates an amount of variation in light and compares the amount of variation in light with a threshold value, a solid-state image sensor, and a method of controlling the electronic circuit.

BACKGROUND ART

Conventionally, a synchronous solid-state image sensor that captures image data (frame) in synchronization with a synchronization signal such as a vertical synchronizing signal has been used in an image capturing device or the like. Since this general synchronous solid-state image sensor can acquire image data only every synchronization signal cycle (for example, 1/60 seconds), it is difficult to handle a case where faster processing is required in the fields related to traffic, robots, and the like. Consequently, there has been proposed an asynchronous solid-state image sensor that detects in real time, as an address event, that the amount of variation in pixel luminance exceeds a threshold value, for each pixel address (see, for example, Patent Document 1). The solid-state image sensor that detects an address event for each pixel as described above is called "dynamic vision sensor (DVS)".

The solid-state image sensor described above includes a differentiating circuit that calculates a differential value (in other words, amount of variation) of a voltage obtained by converting a photocurrent, and a comparator that compares the amount of variation with a threshold value to detect whether or not an address event is present. The differentiating circuit then includes a capacitance and an inverting circuit that are connected in series, and a reset transistor that short-circuits the input and output terminals of the inverting circuit at the time of initialization.

CITATION LIST

Patent Document

Patent Document 1: Japanese Patent Application Laid-Open No. 2016-533140

SUMMARY OF THE INVENTION

Problems to be Solved by the Invention

The asynchronous solid-state image sensor (that is, DVS) described above generates and outputs data much faster than a synchronous solid-state image sensor. For this reason, for example, in the traffic field, the process of recognizing images of people or obstacles is performed at high speed. However, in the DVS described above, switching noise called feedthrough may be generated in a reset transistor when a differentiating circuit is initialized. Due to this switching noise, the voltage at the output terminal of an inverting circuit varies, and the variation may reduce the detection accuracy of an address event.

The present technology has been made in view of such a situation, and an object of the present technology is to suppress voltage variations due to transistor switching noise in a solid-state image sensor including a transistor that initializes a differentiating circuit.

Solutions to Problems

The present technology has been made to solve the above problems, and a first aspect thereof is an electronic circuit and a method of controlling the electronic circuit, and the electronic circuit includes a capacitance that supplies a charge corresponding to an amount of variation in a predetermined pixel voltage to a predetermined input terminal; a voltage output unit that outputs, as an output voltage, a voltage corresponding to an input voltage at the input terminal from a predetermined output terminal; a reset transistor that supplies one of a positive charge or a negative charge during a predetermined period to control the output voltage to an initial value in a case where initialization is instructed; and a charge supply unit that supplies the other of the positive charge or the negative charge when the predetermined period elapses. This achieves the effect that in a case where one of the positive charge or the negative charges is supplied by the reset transistor, the other of the positive or negative charges is supplied by the charge supply unit.

Further, in the first aspect, the voltage output unit may include an inverting circuit, and the reset transistor may be inserted between the input terminal and the output terminal. This achieves the effect that the path between the input terminal and the output terminal is opened and closed at the time of initialization.

Furthermore, in the first aspect, the charge supply unit may be connected to the input terminal. This achieves the effect that the other of the positive charge or the negative charge is supplied to the input terminal.

Further, in the first aspect, a predetermined number of the reset transistors may be connected in parallel between the input terminal and the output terminal. This achieves the effect that the initial value is adjusted.

Furthermore, in the first aspect, the charge supply unit may be inserted between the output terminal and a predetermined terminal. This achieves the effect that the initial value is adjusted.

Further, in the first aspect, the charge supply unit may include a charge supply transistor inserted between the input terminal and the output terminal. This achieves the effect that the leakage current is reduced.

Further, in the first aspect, a predetermined number of the reset transistors may be connected in parallel between the input terminal and the output terminal. This achieves the effect that the leakage current is reduced.

Furthermore, in the first aspect, a predetermined number of the charge supply transistors may be connected in series between the input terminal and the output terminal. This achieves the effect that the leakage current is reduced.

Further, in the first aspect, a predetermined number of the charge supply transistors may be connected in series between the input terminal and the output terminal. This achieves the effect that the timing when the charge supply unit supplies a charge is allowed to be delayed with respect to the timing when the reset transistor supplies a charge.

Furthermore, in the first aspect, the voltage output unit may include a differential amplifier circuit including a pair of differential transistors, the reset transistor may be inserted between an input node and an output node of one of the pair of differential transistors, and the charge supply unit may be connected to an input node of the other of the pair of differential transistors. This achieves the effect that the leakage current is reduced.

Further, in the first aspect, the charge supply unit may include a charge supply transistor that is inserted between the input node and an output node of the other of the pair of differential transistors, and a capacitive element that is connected to the charge supply transistor. This achieves the effect that the charge is further supplied by the capacitive element.

Furthermore, a second aspect of the present technology is a solid-state image sensor including: a current-voltage conversion unit that converts a photocurrent into a voltage and supplies the voltage as a pixel voltage; a capacitance that supplies a charge corresponding to an amount of variation in the pixel voltage to a predetermined input terminal; a voltage output unit that outputs, as an output voltage, a voltage corresponding to an input voltage at the input terminal from a predetermined output terminal; a reset transistor that supplies one of a positive charge or a negative charge during a predetermined period to control the output voltage to an initial value in a case where initialization is instructed; a charge supply unit that supplies the other of the positive charge or the negative charge when the predetermined period elapses; and a comparator that compares the output voltage with a predetermined threshold value. This achieves the effect that in a case where one of the positive charge or the negative charges is supplied by the reset transistor, the other of the positive or negative charges is supplied by the charge supply unit, and an address event is detected.

MODE FOR CARRYING OUT THE INVENTION

Hereinafter, modes for carrying out the present technology (hereinafter, referred to as "embodiments") will be described. The description will be given in the following order.

1. First Embodiment (Example in which N-type Transistor is Added)
2. Second Embodiment (Example in which N-type Transistor is inserted between power supply terminal and input terminal)
3. Third Embodiment (Example in which N-type Transistor is Added to Input Terminal of Differential Amplifier Circuit)
4. Fourth Embodiment (Example in which N-type Transistor is Inserted between Output Terminal and Reference Terminal)
5. Fifth Embodiment (Scan Type)
6. Example of Application to Moving Body

1. First Embodiment

[Configuration Example of Image Capturing Device]

Figure 1:
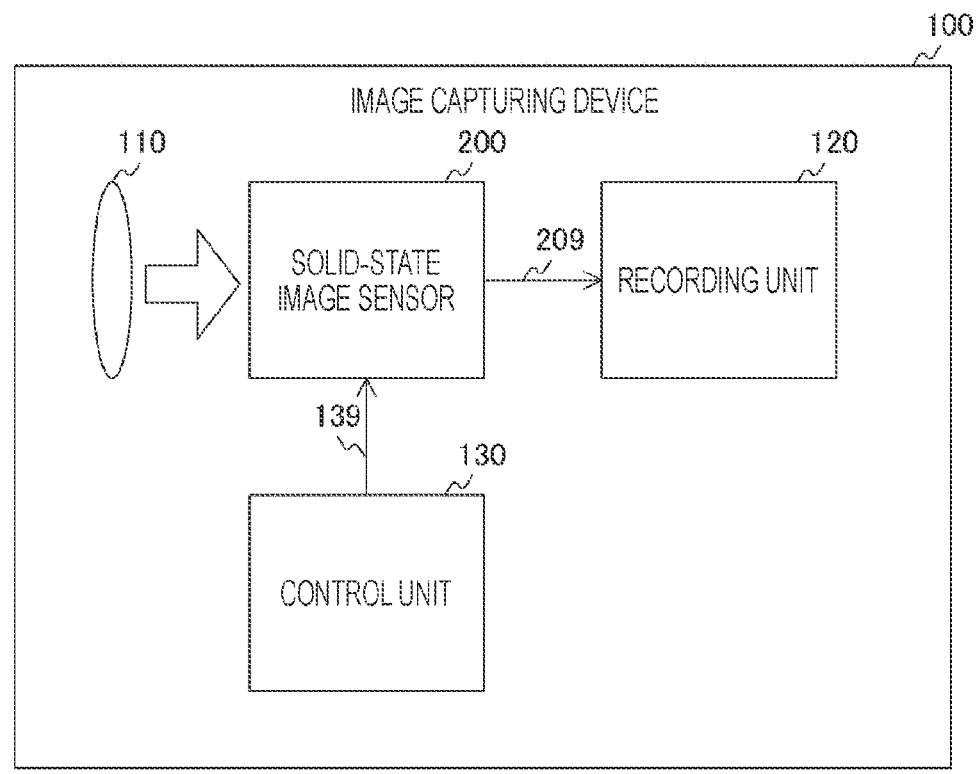
FIG. 1 is a block diagram illustrating a configuration example of an image capturing device in a first embodiment of the present technology.

FIG. 1 is a block diagram illustrating a configuration example of an image capturing device 100 in a first embodiment of the present technology. The image capturing device 100 includes an imaging lens 110, a solid-state image sensor 200, a recording unit 120, and a control unit 130. It is assumed that the image capturing device 100 includes a camera mounted on an industrial robot, an in-vehicle camera, or the like.

The imaging lens 110 collects incident light and guides the incident light to the solid-state image sensor 200. The solid-state image sensor 200 photoelectrically converts incident light to detect the presence or absence of an address event, and generates the detection result. Here, the address event includes an on-event and an off-event, and the detection result includes a 1-bit on-event detection result and a 1-bit off-event detection result. The on-event means that the amount of variation in the luminance of incident light exceeds a predetermined upper limit threshold value. On the other hand, the off-event means that the amount of variation in luminance is lower than a predetermined lower limit threshold value. The solid-state image sensor 200 processes the detection result of the address event and outputs the data indicating the result of processing to the recording unit 120 via a signal line 209. Note that the solid-state image sensor 200 may detect only one of the on-event or the off-event.

The recording unit 120 records data from the solid-state image sensor 200. The control unit 130 controls the solid-state image sensor 200 to detect the presence or absence of an address event.

[Configuration Example of Solid-State Image Sensor]

Figure 2:
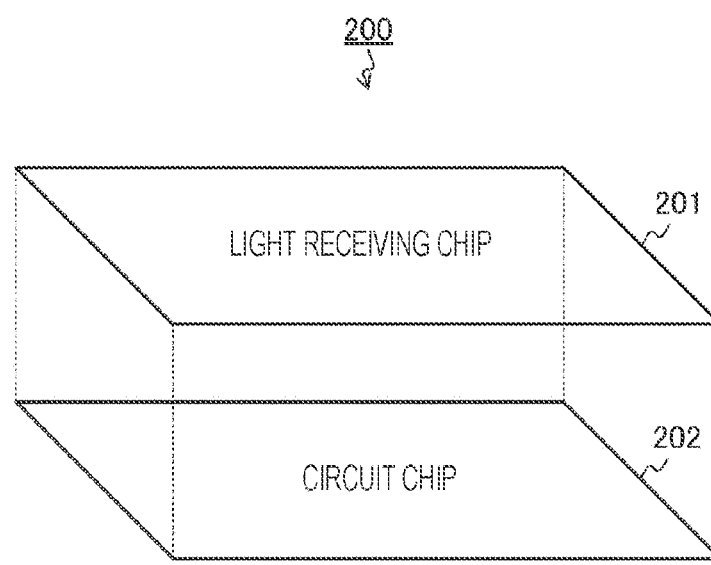
FIG. 2 is a view illustrating an example of a stacked structure of a solid-state image sensor according to the first embodiment of the present technology.

FIG. 2 is a view illustrating an example of a stacked structure of the solid-state image sensor 200 according to the first embodiment of the present technology. The solid-state image sensor 200 includes a circuit chip 202 and a light receiving chip 201 stacked on the circuit chip 202. These chips are electrically connected via a connection part such as a via. Note that, in addition to vias, Cu—Cu bonding or bumps may be used for connection.

Figure 3:
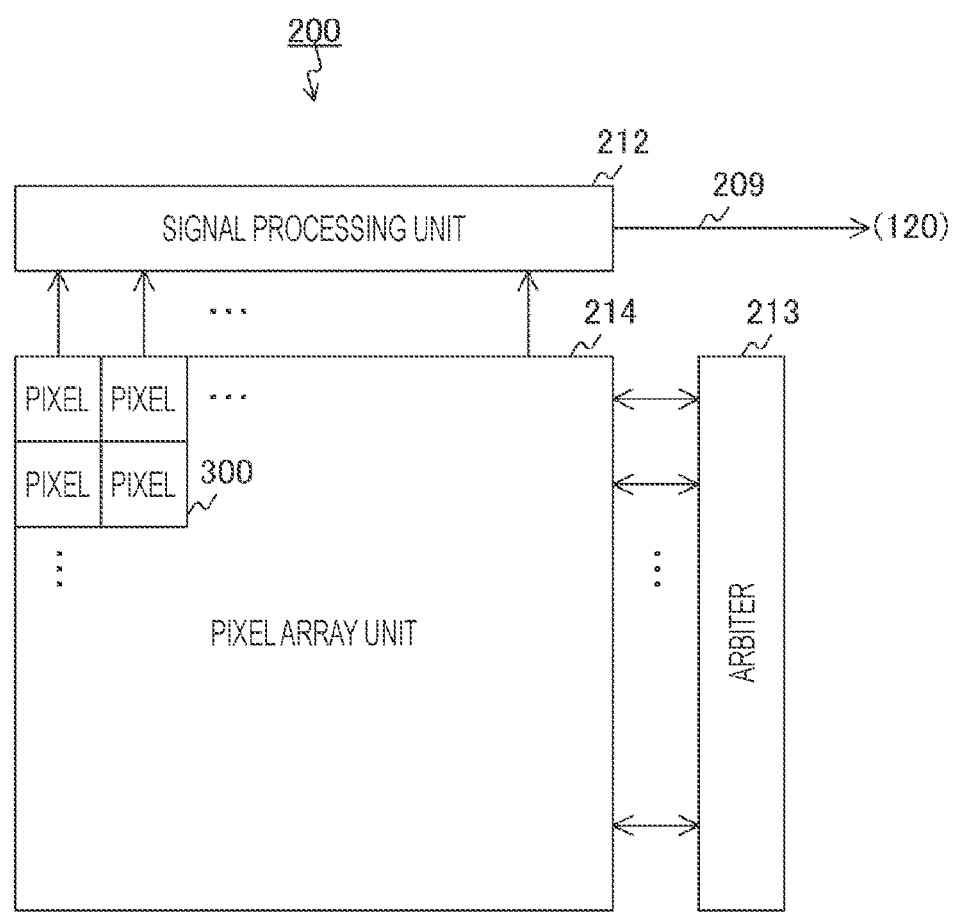
FIG. 3 is a block diagram illustrating a configuration example of the solid-state image sensor according to the first embodiment of the present technology.

FIG. 3 is a block diagram illustrating a configuration example of the solid-state image sensor 200 according to the first embodiment of the present technology. The solid-state image sensor 200 includes a signal processing unit 212, an arbiter 213, and a pixel array unit 214. A plurality of pixels 300 is arranged in a two-dimensional lattice in the pixel array unit 214.

The pixel 300 is used for detecting the presence or absence of an address event. When the address event is detected, the pixel 300 supplies a request for forwarding to the arbiter 213. Upon receiving a response to the request, the pixel 300 supplies a detection signal indicating the detection result to the signal processing unit 212.

The arbiter 213 arbitrates a request from each pixel block and transmits a response based on the arbitration result to the pixel 300.

The signal processing unit 212 performs predetermined signal processing such as an image recognition process on the detection signal from the pixel array unit 214. The signal processing unit 212 supplies data indicating the result of processing to the recording unit 120 via the signal line 209.

[Configuration Example of Pixel]

Figure 4:
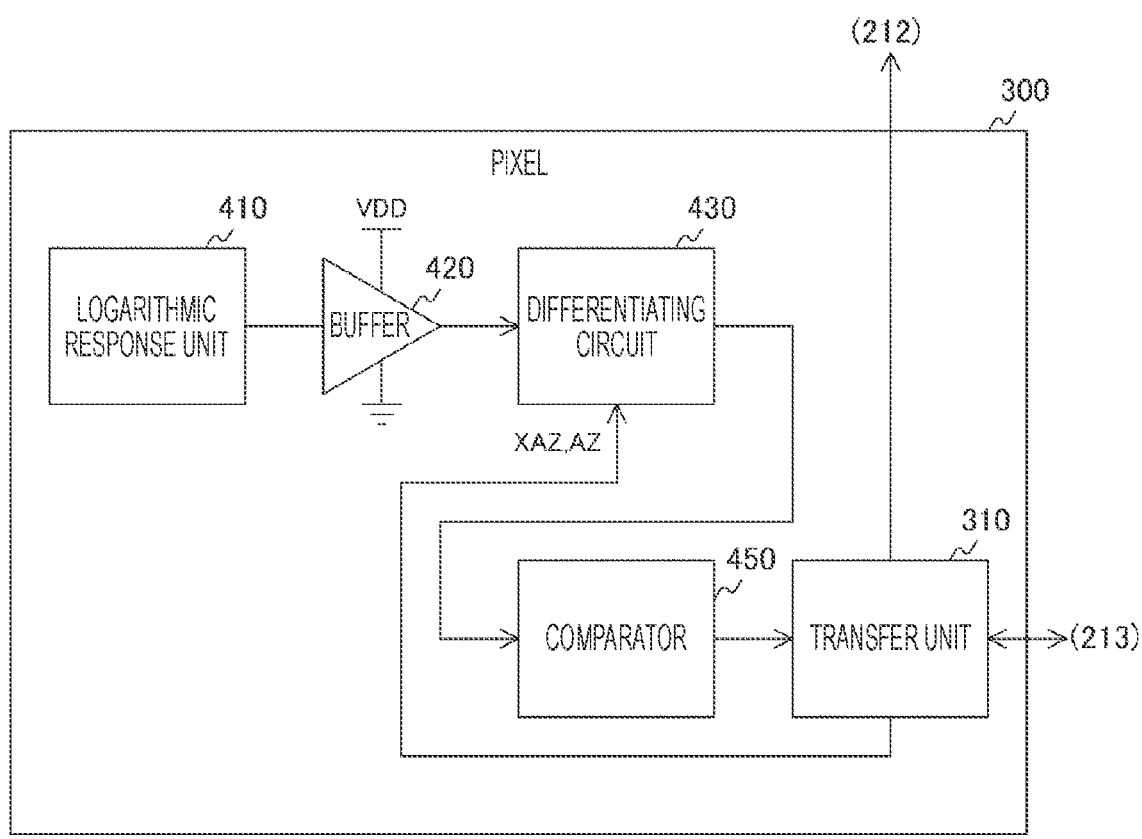
FIG. 4 is a block diagram illustrating a configuration example of a pixel in the first embodiment of the present technology.

FIG. 4 is a block diagram illustrating a configuration example of the pixel 300 in the first embodiment of the present technology. The pixel 300 includes a logarithmic response unit 410, a buffer 420, a differentiating circuit 430, a comparator 450, and a transfer unit 310.

The logarithmic response unit 410 generates a photocurrent by photoelectric conversion and logarithmically converts the photocurrent into a voltage. The logarithmic response unit 410 supplies the converted voltage as a pixel voltage to the buffer 420.

The buffer 420 outputs the input pixel voltage to the differentiating circuit 430. This buffer 420 can improve the driving force for driving a subsequent stage. In addition, the buffer 420 can ensure the isolation of noise associated with a switching operation in the subsequent stage.

The differentiating circuit 430 calculates the amount of variation in a pixel voltage by a differentiating operation. The amount of variation in a pixel voltage indicates the amount of variation in luminance. The differentiating circuit 430 supplies a voltage signal indicating the amount of variation to the comparator 450. Note that the differentiating circuit 430 is an example of an electronic circuit described in the claims.

The comparator 450 compares the amount of variation with a predetermined threshold value. The comparator 450 supplies a signal indicating the comparison result to the transfer unit 310 as an address event detection signal.

The transfer unit 310 transfers a detection signal. When the address event is detected, the transfer unit 310 supplies a request to the arbiter 213. Upon receiving a response to the request from the arbiter 213, the transfer unit 310 supplies a detection signal to the signal processing unit 212. After transferring the detection signal, the transfer unit 310 initializes the differentiating circuit 430.

[Configuration Example of Logarithmic Response Unit and Buffer]

Figure 5:
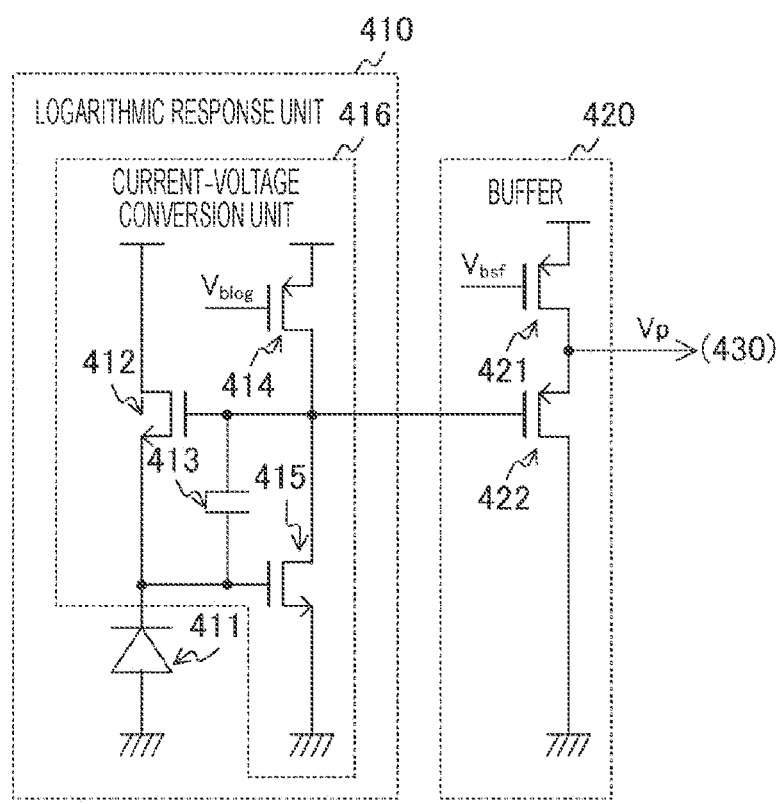
FIG. 5 is a circuit diagram illustrating a configuration example of a logarithmic response unit and a buffer in the first embodiment of the present technology.

FIG. 5 is a circuit diagram illustrating a configuration example of the logarithmic response unit 410 and the buffer 420 in the first embodiment of the present technology. The logarithmic response unit 410 includes a photoelectric conversion element 411 and a current-voltage conversion unit 416. Furthermore, the buffer 420 includes P-type transistors 421 and 422. For example, metal-oxide-semiconductor (MOS) transistors are used as these transistors.

The photoelectric conversion element 411 generates a photocurrent by photoelectric conversion of incident light. The current-voltage conversion unit 416 logarithmically converts the photocurrent into a pixel voltage Vp. The current-voltage conversion unit 416 includes N-type transistors 412 and 415, a capacitance 413, and a P-type transistor 414. For example, a MOS transistor is used as the N-type transistor 412, the P-type transistor 414, and the N-type transistor 415.

The source of the N-type transistor 412 is connected to a cathode of the photoelectric conversion element 411, and the drain is connected to a power supply terminal. The P-type transistor 414 and the N-type transistor 415 are connected in series between the power supply terminal and a reference terminal having a predetermined reference potential (ground potential or the like). Furthermore, the connection point between the P-type transistor 414 and the N-type transistor 415 is connected to a gate of the N-type transistor 412 and an input terminal of the buffer 420. The connection point between the N-type transistor 412 and the photoelectric conversion element 411 is connected to a gate of the N-type transistor 415.

Further, a predetermined bias voltage $V_{blog}$ is applied to a gate of the P-type transistor 414. The capacitance 413 is inserted between the gate of the N-type transistor 412 and the gate of the N-type transistor 415.

With the connection configuration described above, the photocurrent from the photoelectric conversion element 411 is converted into the logarithmic pixel voltage Vp.

For example, the photoelectric conversion element 411 is arranged on the light receiving chip 201, and the circuit in the subsequent stage is arranged on the circuit chip 202. Note that the circuits and elements arranged on the light receiving chip 201 and the circuit chip 202 are not limited to this configuration. For example, the photoelectric conversion element 411, the N-type transistors 412 and 415, and the capacitance 413 may be arranged on the light receiving chip 201, and the circuit in the subsequent stage may be arranged on the circuit chip 202.

Further, in the buffer 420, the P-type transistors 421 and 422 are connected in series between the power supply terminal and the reference potential terminal. Furthermore, the gate of the P-type transistor 422 is connected to the logarithmic response unit 410, and the connection point of the P-type transistors 421 and 422 is connected to the differentiating circuit 430. A predetermined bias voltage $V_{bsf}$ is applied to a gate of the P-type transistor 421.

[Configuration Example of Differentiating Circuit and Comparator]

Figure 6:
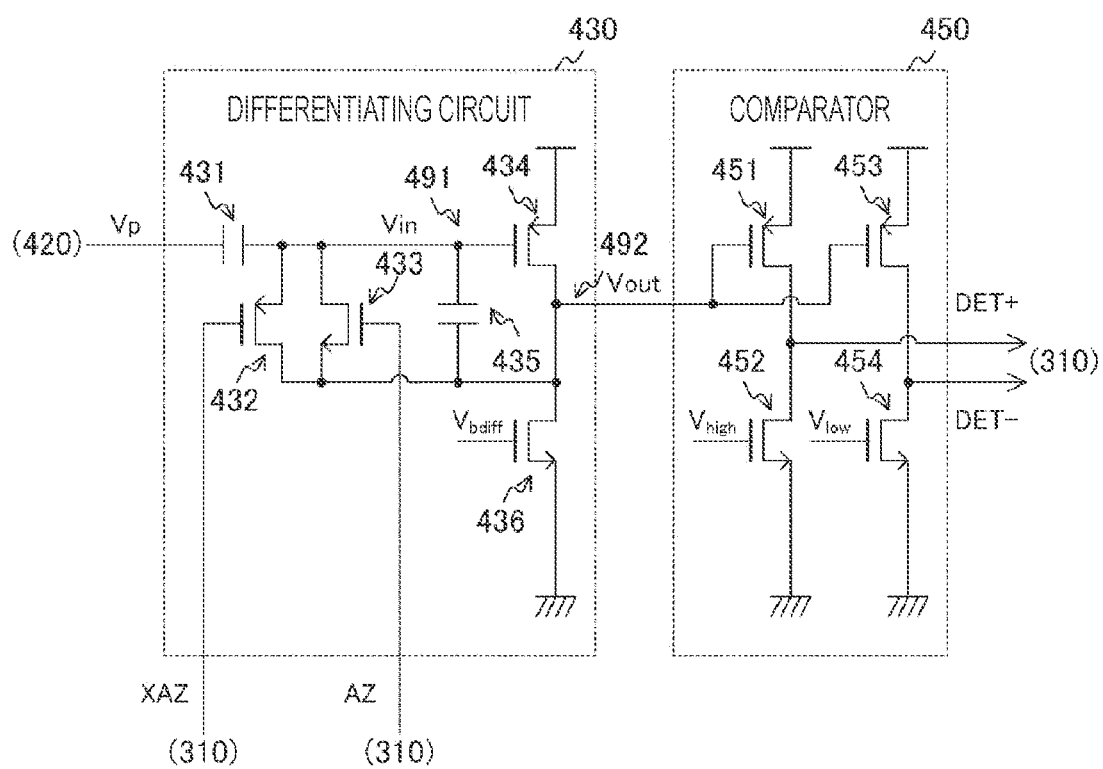
FIG. 6 is a circuit diagram illustrating a configuration example of a differentiating circuit and a comparator in the first embodiment of the present technology.

FIG. 6 is a circuit diagram illustrating a configuration example of the differentiating circuit 430 and the comparator 450 in the first embodiment of the present technology.

The differentiating circuit 430 includes capacitances 431 and 435, P-type transistors 432 and 434, and N-type transistors 433 and 436. For example, a MOS transistor is used as a transistor in the differentiating circuit 430. Further, the comparator 450 includes P-type transistors 451 and 453 and N-type transistors 452 and 454. For example, MOS transistors are used as these transistors.

The P-type transistor 434 and the N-type transistor 436 are connected in series between the power supply terminal and the reference potential terminal. A predetermined bias voltage $V_{bdiff}$ is input to a gate of the N-type transistor 436. These transistors function as an inverting circuit in which the gate of the P-type transistor 434 is an input terminal 491 and the connection point of the P-type transistor 434 and the N-type transistor 436 is an output terminal 492.

The capacitance 431 is inserted between the buffer 420 and the input terminal 491. The capacitance 431 supplies a charge corresponding to a time derivative (in other words, amount of variation) of the pixel voltage Vp from the buffer 420 to the input terminal 491. Further, the capacitance 435 is inserted between the input terminal 491 and the output terminal 492.

The P-type transistor 432 opens and closes the path between the input terminal 491 and the output terminal 492 according to a control signal AZ instructing initialization and a control signal XAZ having an opposite polarity. For example, upon transferring a detection signal, the transfer unit 310 changes the control signal AZ from a low level to a high level and changes the control signal XAZ from a high level to a low level during a certain pulse period to instruct initialization. The timing of inversion of the control signal AZ is adjusted so as to substantially match the timing of inversion of the control signal XAZ. The P-type transistor 432 then shifts to an on-state during the pulse period according to the control signal XAZ, and supplies a positive charge (in other words, current) from the input terminal 491 to the output terminal 492.

The N-type transistor 433 opens and closes the path between the input terminal 491 and the output terminal 492 according to the control signal AZ instructing initialization. The N-type transistor 433 shifts to the on-state during the pulse period according to the control signal AZ, and supplies a negative charge from the output terminal 492 to the input terminal 491. As a result, a current flows from the input terminal 491 to the output terminal 492.

As the P-type transistor 432 and the N-type transistor 433 shift to the on-state during the pulse period, an input voltage Vin, which is the voltage of the input terminal 491, and an output voltage Vout, which is the voltage of the output voltage 492, are initialized. Hereinafter, this pulse period is referred to as "reset period", and a period other than the pulse period is referred to as "detection period" for detecting an address event.

Meanwhile, during the address event detection period, the P-type transistor 432 and the N-type transistor 433 shift to an off-state. In this detection period, the differentiating circuit 430 outputs the output voltage Vout corresponding to the time derivative (amount of variation) of the pixel voltage Vp.

Here, when the pulse period (reset period) elapses, the P-type transistor 432 shifts from the on-state to the off-state. In this case, a part of the positive charge in a P channel of the P-type transistor 432 flows into the input terminal 491, and thus the input voltage Vin rises due to a parasitic capacitance. Consequently, the output voltage Vout obtained by inverting the input voltage Vin decreases. As described above, the voltage variation in a case where the transistor shifts to the off state is called "feedthrough". If it is configured so as not to arrange the N-type transistor 433, the value immediately after the initialization of the output voltage Vout deviates from a design value due to the influence of this feedthrough. As a result, the design margin of the differentiating circuit 430 and the design margin of the comparator 450 in the subsequent stage are reduced. As a result, while the on-event is easily detected, the off-event is less likely to be detected, and the detection accuracy of the address event decreases.

However, since the differentiating circuit 430 described above includes the N-type transistor 433, the N-type transistor 433 supplies a negative charge to the input terminal 491 when the reset period elapses. Due to this negative charge, the voltage variation opposite to the voltage variation caused by the P-type transistor 432 occurs. As a result, these voltage variations are offset, the output voltage Vout immediately after initialization is stabilized, and a decrease in detection accuracy is suppressed.

Note that, even if the N-type transistor 433 is not provided, the voltage variation can be suppressed by using a method of increasing the capacitance value of the capacitance 431 or the capacitance 435. However, using this method is not desirable because the current consumption and circuit scale of the differentiating circuit 430 are increased.

Note that one of the P-type transistor 432 or the N-type transistor 433 (P-type transistor 432, or the like) is an example of a reset transistor described in the claims, whereas the N-type transistor 433 or the like is an example of a charge supply unit described in the claims.

In the comparator 450, the P-type transistor 451 and the N-type transistor 452 are connected in series between the power supply terminal and the reference terminal, and the P-type transistor 453 and the N-type transistor 454 are also connected in series between the power supply terminal and the reference terminal. Further, the gates of the P-type transistors 451 and 453 are connected to the differentiating circuit 430. A threshold voltage $V_{high}$ indicating an upper limit threshold value is applied to a gate of the N-type transistor 452, and a threshold voltage $V_{low}$ indicating a lower limit threshold value is applied to a gate of the N-type transistor 454.

The connection point of the P-type transistor 451 and the N-type transistor 452 is connected to the transfer unit 310, and the voltage at this connection point is output as an on-event detection result DET+. The connection point of the P-type transistor 453 and the N-type transistor 454 is also connected to the transfer unit 310, and the voltage at this connection point is output as an off-event detection result DET−. With such a connection, the comparator 450 outputs a high-level detection signal DET+ in a case where the amount of variation in luminance exceeds the upper limit threshold value, and outputs a low-level detection signal DET− in a case where the amount of variation is lower than the limit threshold value.

Note that the comparator 450 detects both on-events and off-events, but may detect only one of the on-event or the off-event. In this case, unnecessary transistors can be eliminated. For example, in a case where only the on-event is detected, only the P-type transistor 451 and the N-type transistors 452 are arranged.

Figure 7:
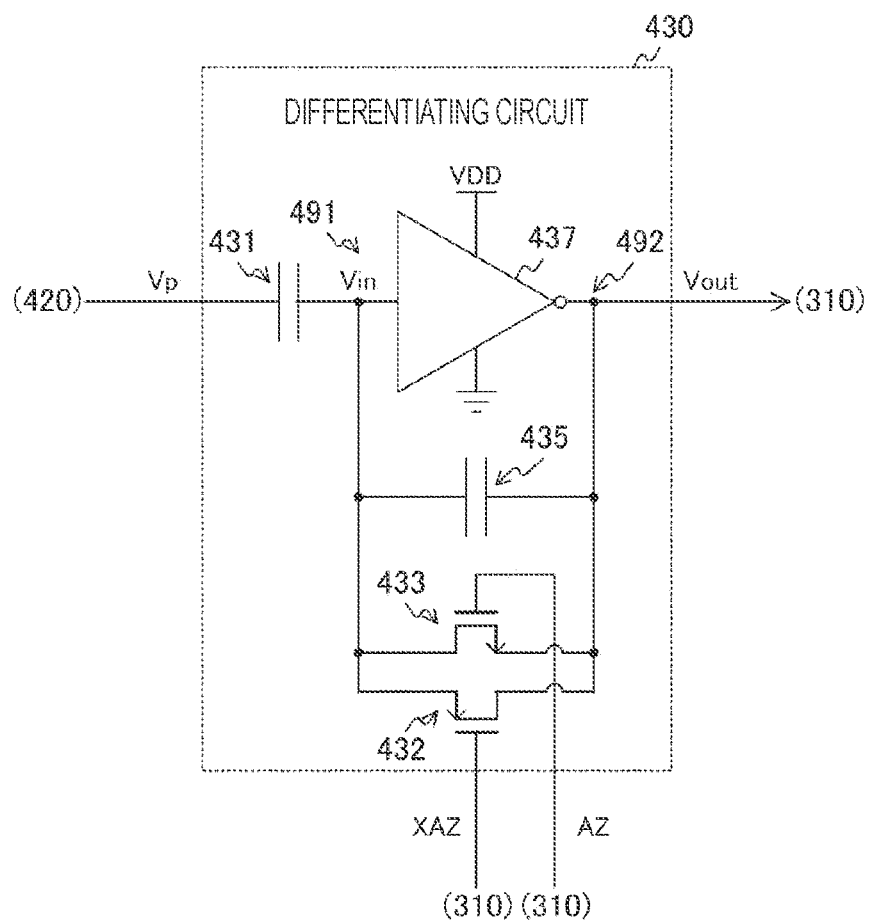
FIG. 7 illustrates an example of an equivalent circuit of the differentiating circuit in the first embodiment of the present technology.

FIG. 7 is an example of an equivalent circuit of the differentiating circuit 430 in the first embodiment of the present technology. The P-type transistor 434 and the N-type transistor 436 in the circuit illustrated in FIG. 6 correspond to an inverting circuit 437 in FIG. 7. Note that the inverting circuit 437 is an example of a voltage output unit described in the claims.

Figure 8:
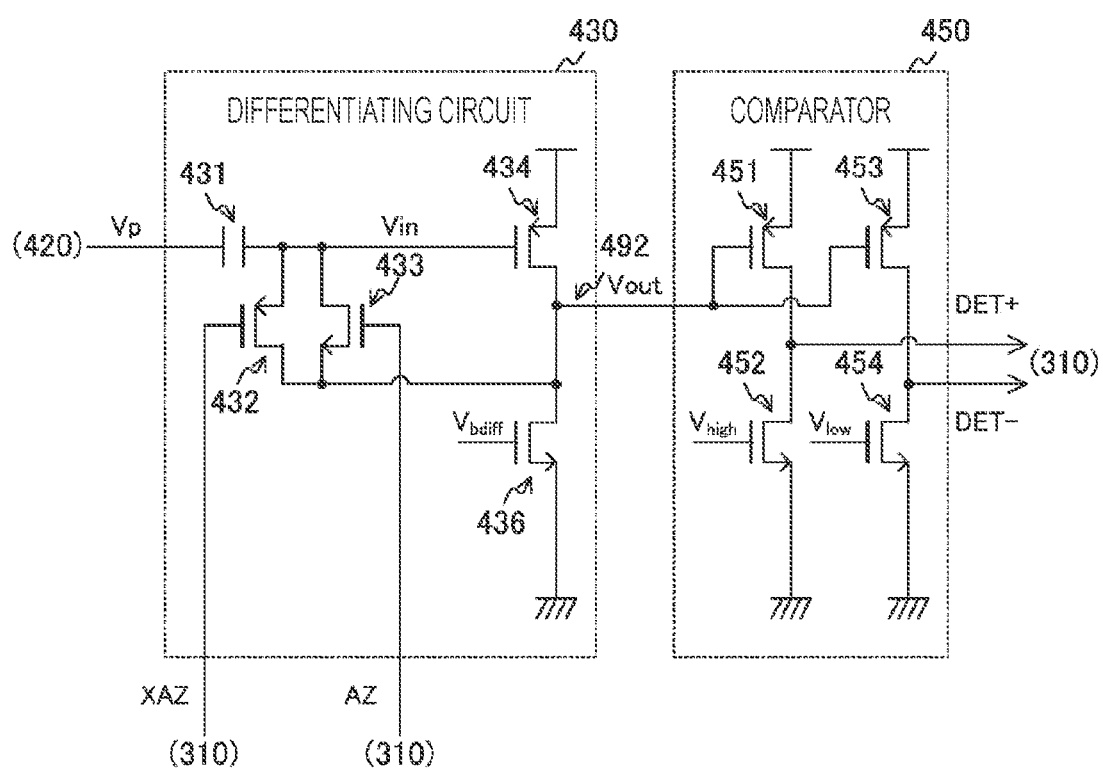
FIG. 8 is a circuit diagram illustrating a configuration example of a differentiating circuit with a capacitance eliminated and the comparator in the first embodiment of the present technology.
Figure 9:
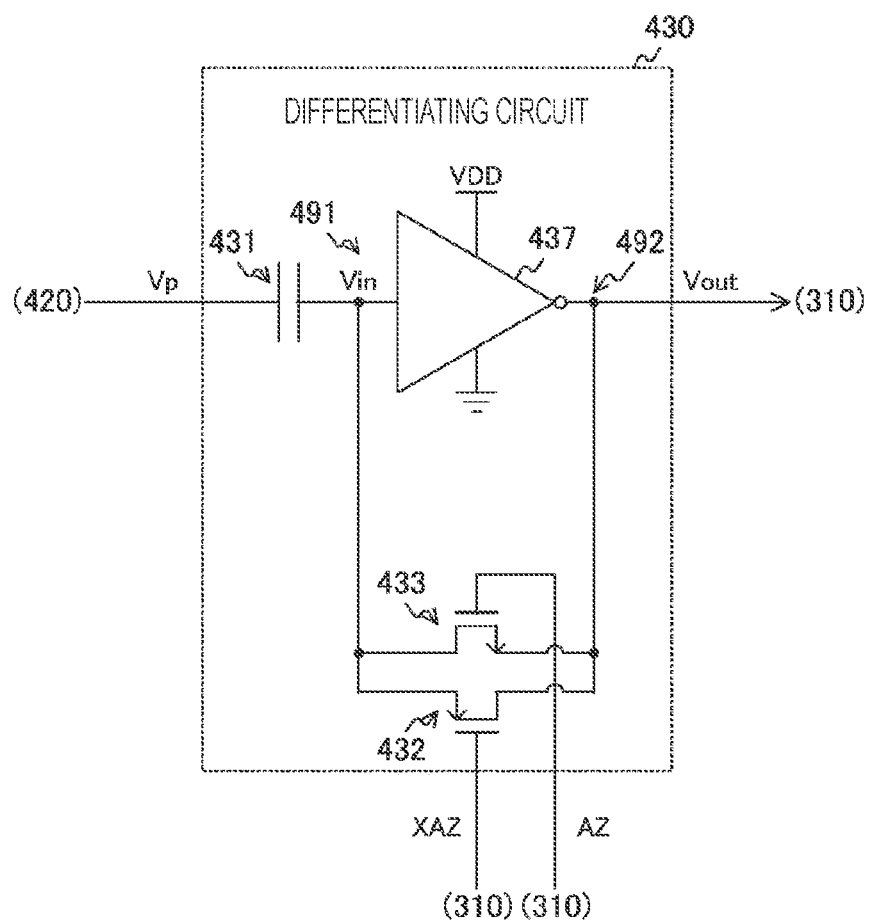
FIG. 9 is an example of an equivalent circuit of the differentiating circuit with the capacitance eliminated in the first embodiment of the present technology.

Note that the capacitance 435 is connected in parallel to a feedback signal path in FIG. 6, but the capacitance 435 can be eliminated as illustrated in FIG. 8. Similarly, as illustrated in FIG. 9, the capacitance 435 illustrated in FIG. 7 can be eliminated.

Figure 10A:
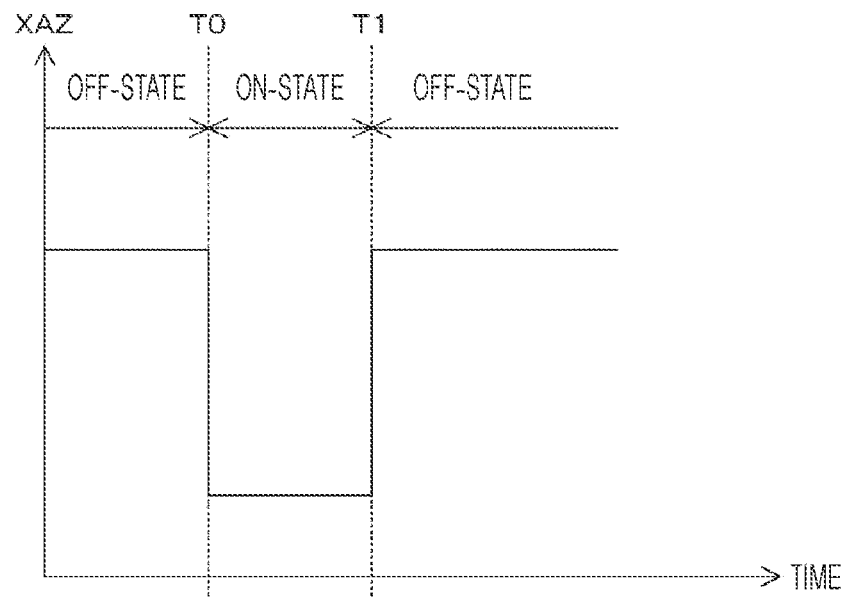
FIGS. 10A and 10B are timing charts illustrating an example of changes in control signal and output voltage in the first embodiment of the present technology.
Figure 10B:
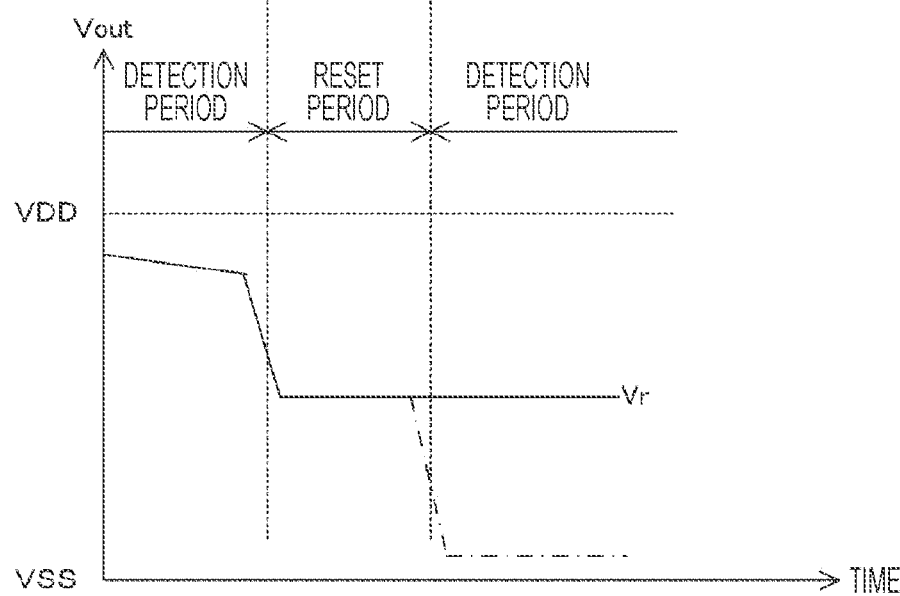

FIGS. 10A and 10B are timing charts is a timing chart illustrating an example of changes in the control signal XAZ and the output voltage Vout in the first embodiment of the present technology. FIG. 10A illustrates an example of the change in the control signal XAZ, and FIG. 10B illustrates an example of the change in the output voltage Vout.

When the transfer of a detection signal is completed, the transfer unit 310 shifts the control signal XAZ from a high level to a low level during the reset period from a timing T0 to a timing T1. The P-type transistor 432 thus shifts to the on-state, and controls the output voltage Vout to a predetermined initial value Vr.

At the timing T1 when the pulse period elapses, the control signal XAZ is then controlled to a high level, and the P-type transistor 432 shifts from the on-state to the off-state. In the configuration in which the N-type transistor 433 is not arranged, the input voltage Vin rises due to feedthrough, and the output voltage Vout decreases accordingly. The alternate long and short dash line in FIGS. 10A and 10B indicate the trajectory of a comparative example in which the N-type transistor 433 is not arranged.

Since the N-type transistor 433 is provided in the differentiating circuit 430, at the timing T1, a negative charge is supplied from the N-type transistor 433 to the input terminal 491, the input voltage Vin decreases, and the output voltage Vout rises accordingly. In this way, the voltage variation due to the feedthrough of the P-type transistor 432 is offset by the voltage variation due to the N-type transistor 433.

[Operation Example of Solid-State Image Sensor]

Figure 11:
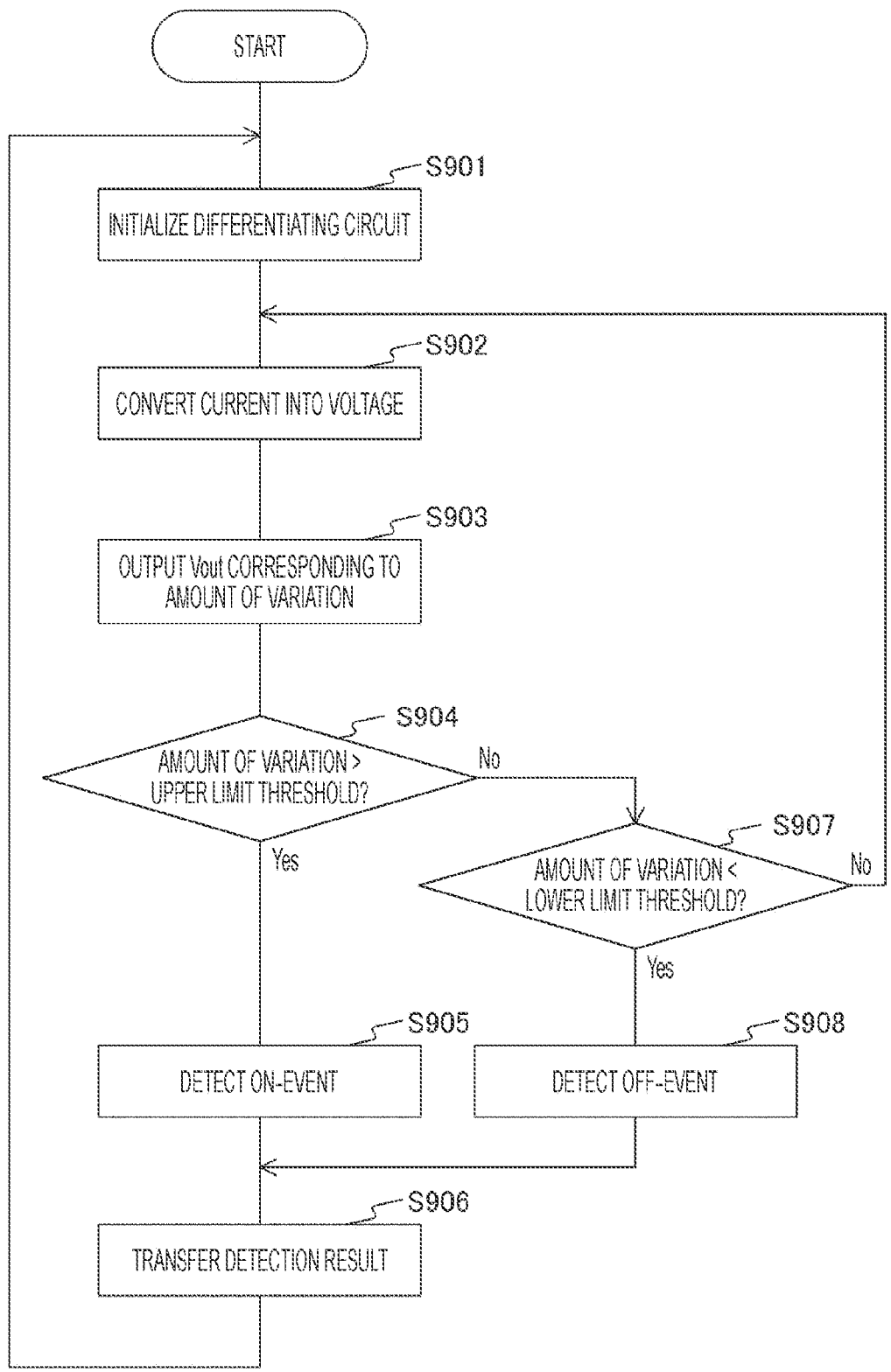
FIG. 11 is a flowchart illustrating an example of an operation of the solid-state image sensor according to the first embodiment of the present technology.

FIG. 11 is a flowchart illustrating an example of an operation of the solid-state image sensor according to the first embodiment of the present technology. This operation starts, for example, when a predetermined application for detecting the presence or absence of an address event is performed.

The transfer unit 310 initializes the differentiating circuit 430 using the control signals AZ and XAZ (step S901). The logarithmic response unit 410 converts a photocurrent into a pixel voltage (step S902), and the differentiating circuit 430 outputs the output voltage Vout corresponding to the amount of variation in luminance (step S903). The comparator 450 compares the output voltage Vout with the threshold voltage $V_{high}$, and determines whether or not the amount of variation in luminance exceeds an upper limit threshold (step S904).

In a case where the amount of variation exceeds the upper threshold (step S904: Yes), the comparator 450 detects an on-event (step S905). On the other hand, in a case where the amount of variation is equal to or less than the upper limit threshold value (step S904: No), the comparator 450 compares the output voltage Vout with the threshold voltage $V_{low}$ and determines whether or not the amount of variation in luminance is lower than a lower limit threshold value (step S907).

In a case where the amount of variation is lower than the lower limit threshold (step S907: Yes), the comparator 450 detects an off-event (step S908). On the other hand, in a case where the amount of variation is equal to or more than the lower threshold value (step S907: No), the pixel 300 repeats step S902 and subsequent steps.

After step S905 or S908, the transfer unit 310 transfers the detection result (step S906), and repeats step S901 and subsequent steps.

As described above, according to the first embodiment of the present technology, since the P-type transistor 432 supplies a positive charge and the N-type transistor 433 supplies a negative charge at the time of initialization, the voltage variation at the time of switching due to those charges can be suppressed. As a result, the detection accuracy of address events can be improved.

First Modification

In the first embodiment described above, one P-type transistor 432 and one N-type transistor 433 are provided to control the output voltage Vout to a constant initial value, but the initial value may deviate from a design value depending on the temperature, voltage, process, and the like. The differentiating circuit 430 of a first modification of the first embodiment is different from that of the first embodiment in that the initial value can be adjusted.

Figure 12:
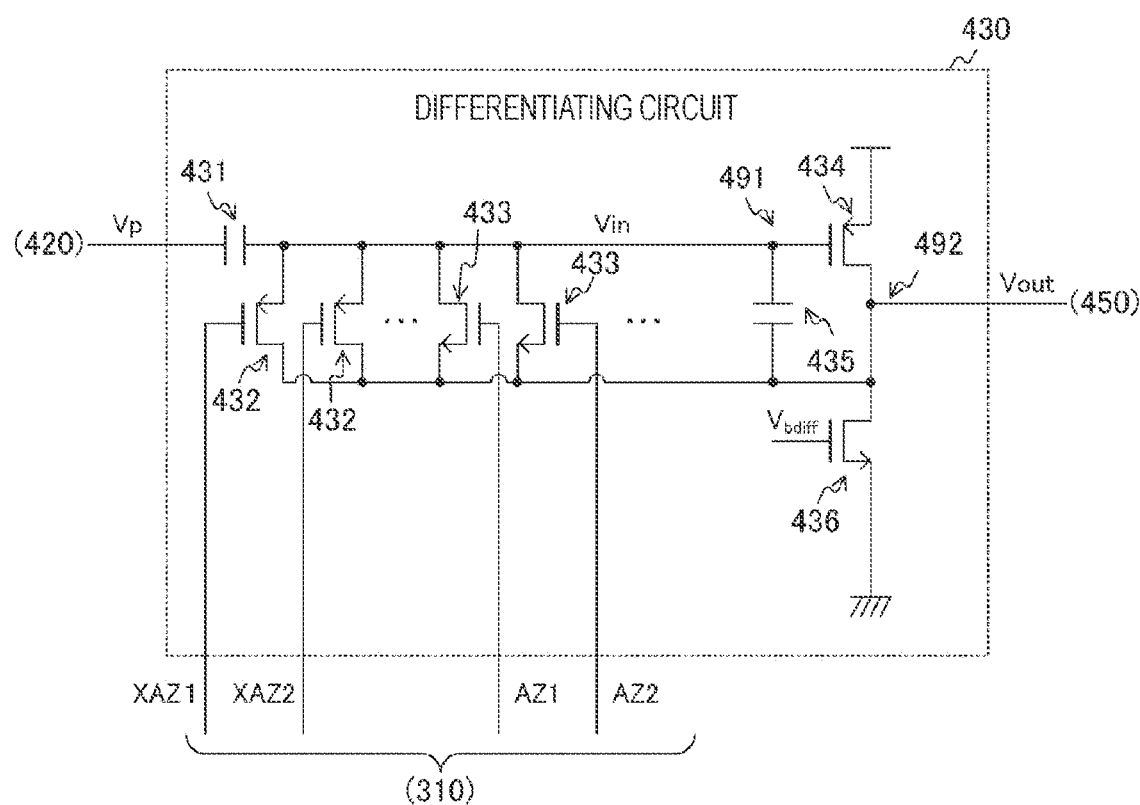
FIG. 12 is a circuit diagram illustrating a configuration example of a differentiating circuit in a first modification of the first embodiment of the present technology.

FIG. 12 is a circuit diagram illustrating a configuration example of the differentiating circuit 430 in the first modification of the first embodiment of the present technology. The differentiating circuit 430 of the first modification of the first embodiment is different from that of the first embodiment in that M P-type transistors 432 and M N-type transistors 433 (M is integer equal to or larger than 2) are arranged. These transistors are connected in parallel between the input terminal 491 and the output terminal 492.

Further, the control signal includes M AZm (m is integer of 1 to M) and M XAZm. The control signals AZm and XAZm are respectively input to a gate of an mth P-type transistor 432 and a gate of an mth N-type transistor 433. The transfer unit 310 can change the number of transistors to be turned on at the time of initialization by these control signals. The initial value of the output voltage Vout can be adjusted by changing the number of transistors in the on-state. The initial value is adjusted at the time of shipping from a factory or at the time of repair, for example.

Note that the number of the P-type transistors 432 is equal to the number of the N-type transistors 433, but the numbers may be different. Further, it may be configured such that one of the P-type transistor 432 or the N-type transistor 433 is provided in single and the other one is provided in plural.

As described above, according to the first modification of the first embodiment of the present technology, since a plurality of the P-type transistors 432 and a plurality of the N-type transistors 433 are connected in parallel, the number of transistors to be turned on at the time of initialization can be changed. As a result, the initial value of the output voltage Vout can be adjusted.

Second Modification

In the first embodiment described above, the P-type transistor 432 and the N-type transistor 433 are in the off-state during the detection period, but there is a possibility that the leakage current flows in these transistors in the off-state and power consumption may increase. The differentiating circuit 430 of a second modification of the first embodiment is different from that of the first embodiment in that the leakage current is suppressed by connecting the transistors in series.

Figure 13:
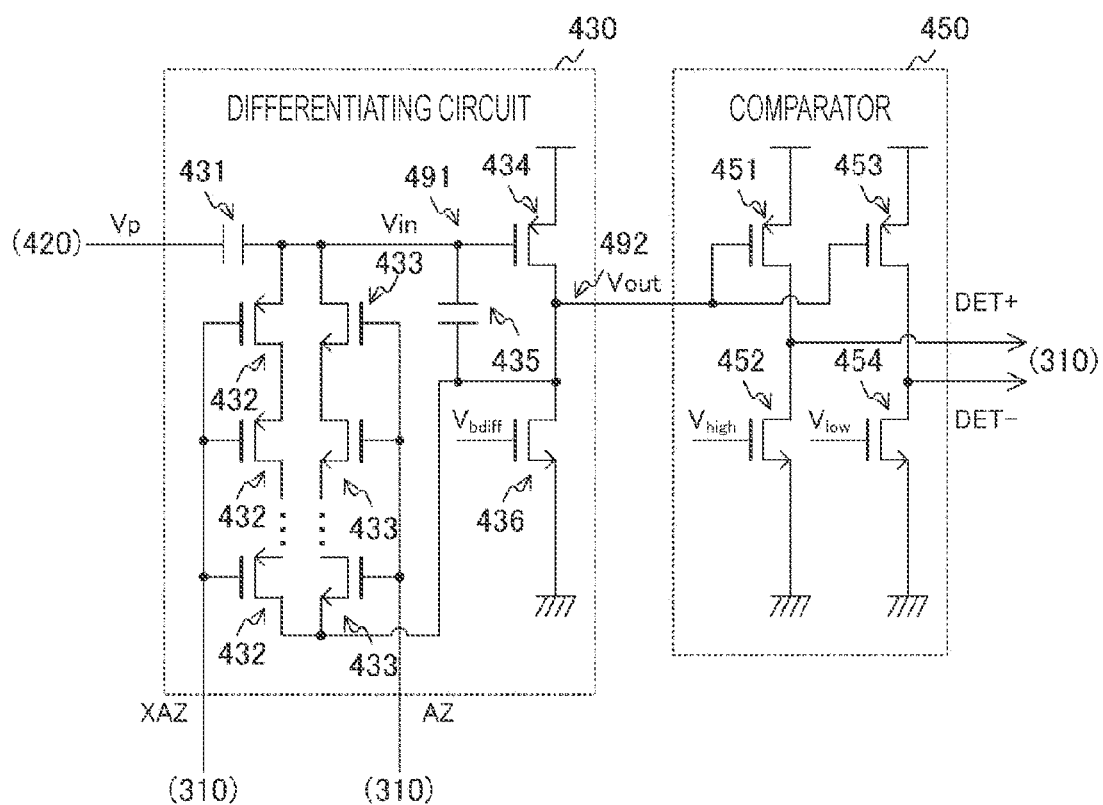
FIG. 13 is a circuit diagram illustrating a configuration example of a differentiating circuit and a comparator in a second modification of the first embodiment of the present technology.

FIG. 13 is a circuit diagram illustrating a configuration example of the differentiating circuit 430 and the comparator 450 in the second modification of the first embodiment of the present technology. The differentiating circuit 430 of the second modification of the first embodiment is different from that of the first embodiment in that M P-type transistors 432 and M N-type transistors 433 (M is integer equal to or larger than 2) are arranged. M P-type transistors 432 are connected in series between the input terminal 491 and the output terminal 492, and M N-type transistors 433 are also connected in series between the input terminal 491 and the output terminal 492.

Further, the control signal XAZ is commonly input to the M P-type transistors 432, and the control signal AZ is also commonly input to the M N-type transistors 433.

By connecting the M P-type transistors 432 in series, the combined resistance of the off resistances of those transistors in the off-state is M times larger, and thus the leakage current decreases. The same holds true for the N-type transistor 433.

Note that the number of the P-type transistors 432 is equal to the number of the N-type transistors 433, but the numbers may be different. Further, it may be configured such that one of the P-type transistor 432 or the N-type transistor 433 is provided in single and the other one is provided in plural.

Figure 14:
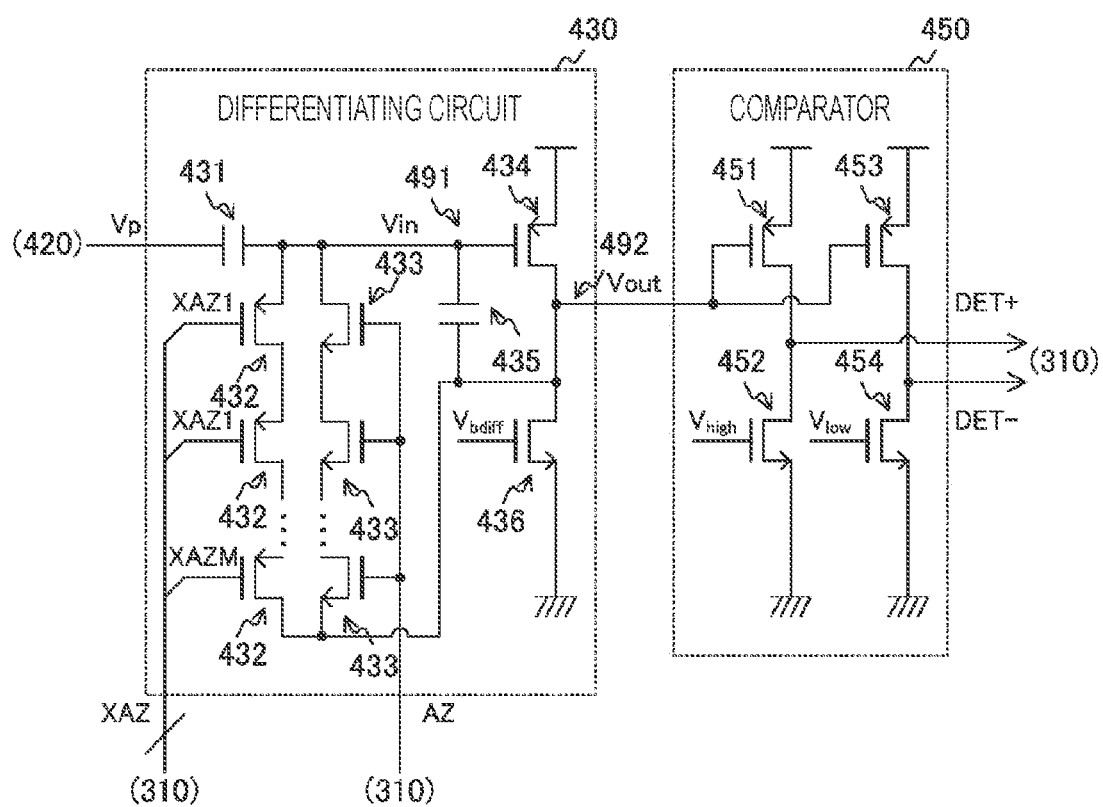
FIG. 14 is a circuit diagram illustrating a configuration example of a differentiating circuit using a plurality of control signals having a different timing and a comparator in the second modification of the first embodiment of the present technology.
Figure 15:
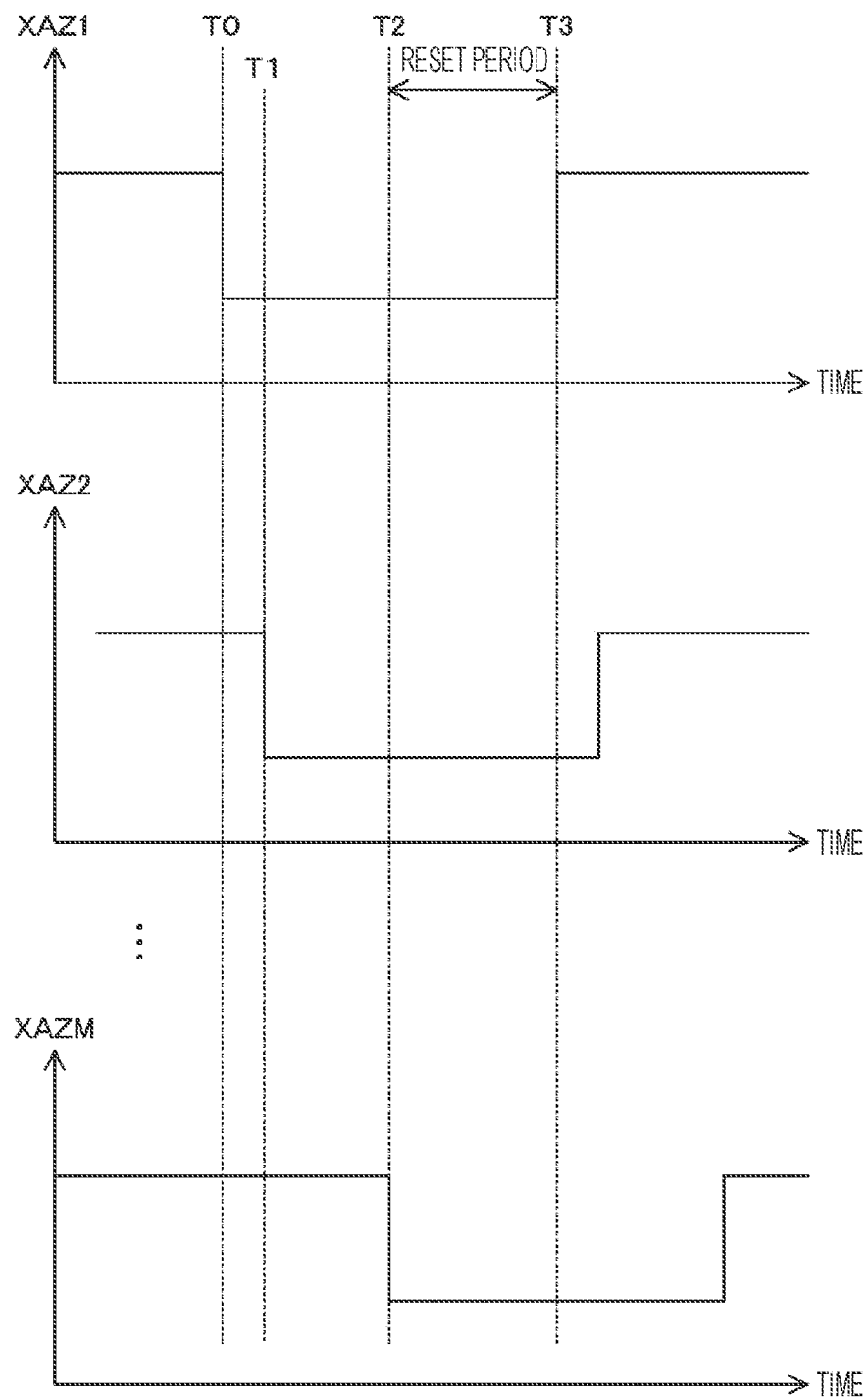
FIG. 15 is a timing chart illustrating an example of a change in control signal in the second modification of the first embodiment of the present technology.

Alternatively, as illustrated in FIG. 14, a control signal having a different timing can be input to each of the M P-type transistors 432. In this case, the control signal XAZ includes M control signals XAZm (m is integer of 1 to M), and the control signal XAZm is input to the mth P-type transistor 432. Further, as illustrated in FIG. 15, the M control signals XAZm have a different timing of controlling a transistor to be in the on-state. For example, a control signal XAZ1 changes from a high level to a low level at the timing T0, and a control signal XAZ2 changes to a low level at the timing T1 immediately after the timing T0. A control signal XAZM changes to a low level at the subsequent timing T2. The control signal XAZ1 then changes to a high level at a timing T3 after the timing T2, and thereafter, the control signals XAZ2 to XAZM change to a high level in order. With such control, all of the M P-type transistors 432 shift to the on-state during the reset period from the timing T2 to the timing T3, and thus initialization is performed. In addition, as the timing of turning on a transistor is shifted, switching noise can be suppressed.

As described above, according to the second modification of the first embodiment of the present technology, since a plurality of the P-type transistors 432 and a plurality of the N-type transistors 433 are connected in parallel, the combined resistance of transistors in the off-state can be increased. As a result, the leakage current can be suppressed.

2. Second Embodiment

In the first embodiment described above, the P-type transistor 432 and the N-type transistor 433 are in the off-state during the detection period, but there is a possibility that the leakage current flows in these transistors in the off-state and power consumption may increase. The differentiating circuit 430 of a second embodiment is different from that of the first embodiment in that the leakage current is suppressed by connecting transistors in series.

Figure 16:
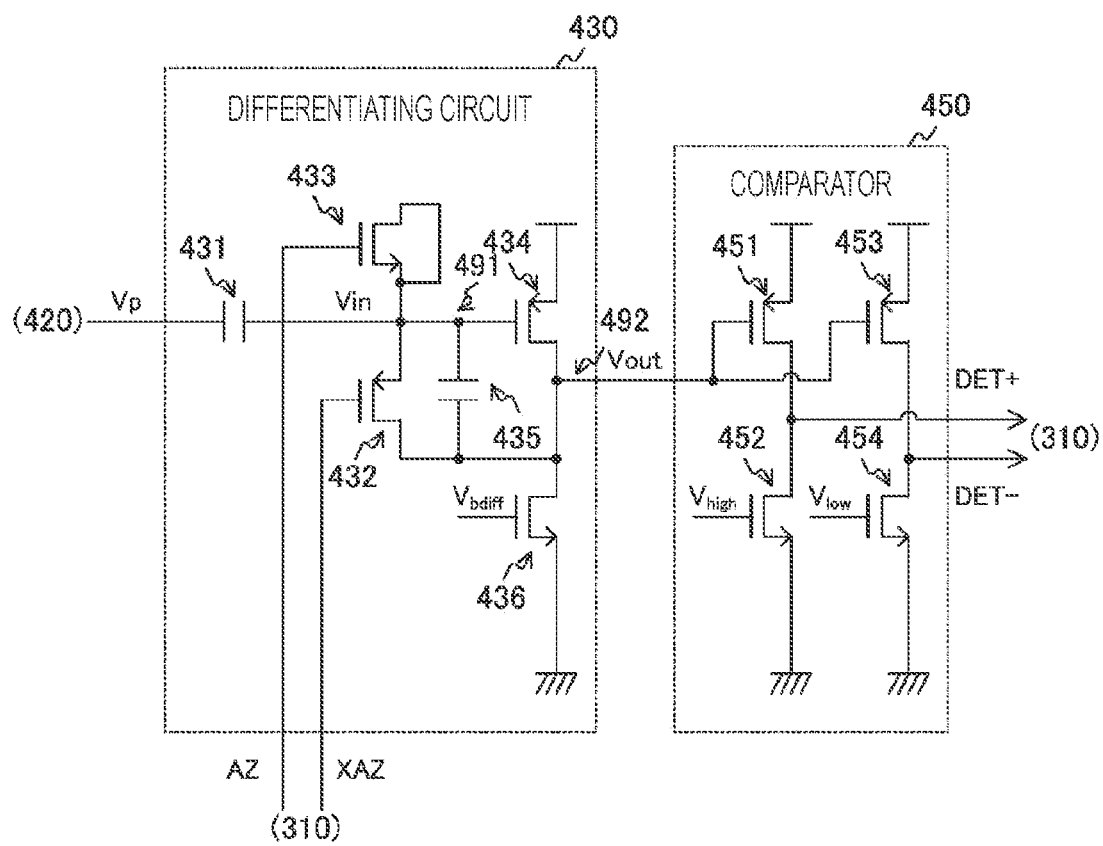
FIG. 16 is a circuit diagram illustrating a configuration example of a differentiating circuit and a comparator in a second embodiment of the present technology.

FIG. 16 is a circuit diagram illustrating a configuration example of the differentiating circuit 430 and the comparator 450 in the second embodiment of the present technology. The differentiating circuit 430 of the second embodiment is different from that of the first embodiment in that the source of the N-type transistor 433 whose source and drain are short-circuited is connected to the input terminal 491.

Since the N-type transistor 433 supplies a negative charge when the reset period elapses, the voltage variation due to the feedthrough of the P-type transistor 432 can be offset. Further, since the P-type transistor 432 and the N-type transistor 433 are connected in series, the leakage current can be reduced.

Figure 17:
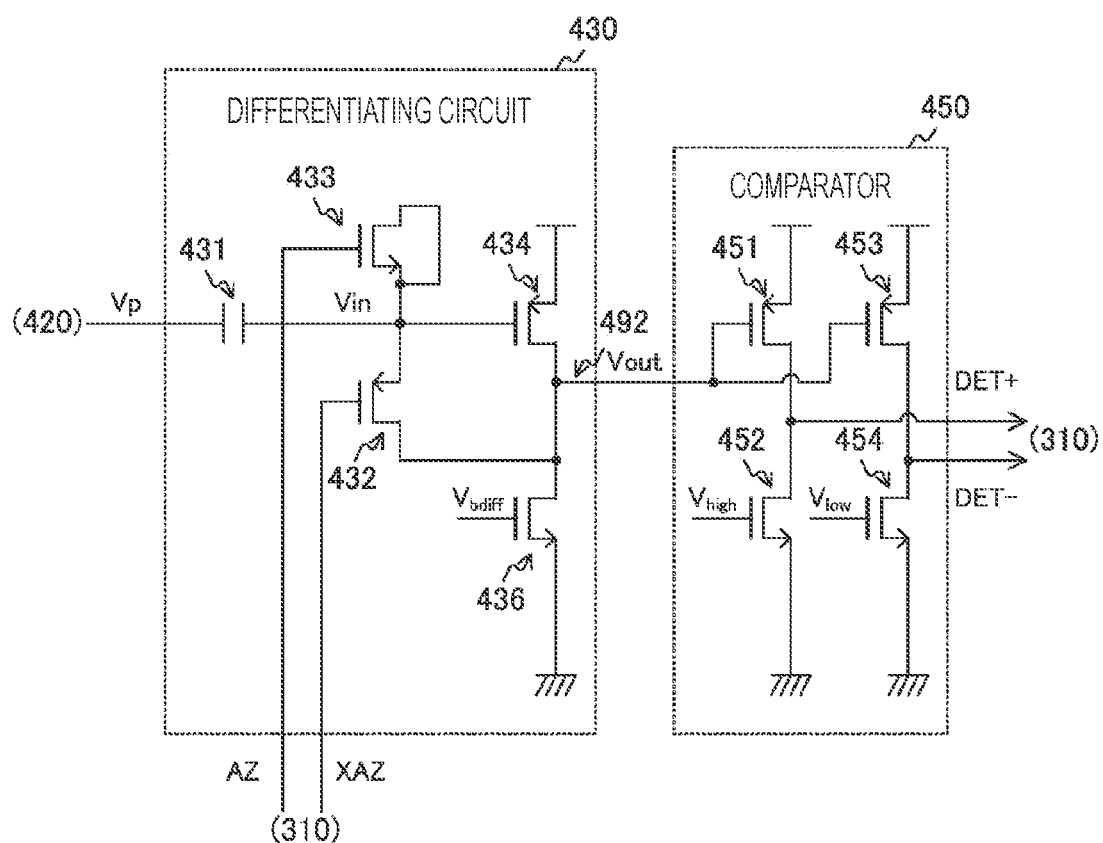
FIG. 17 is a circuit diagram illustrating a configuration example of a differentiating circuit with a capacitance eliminated and the comparator in the second embodiment of the present technology.
Figure 18:
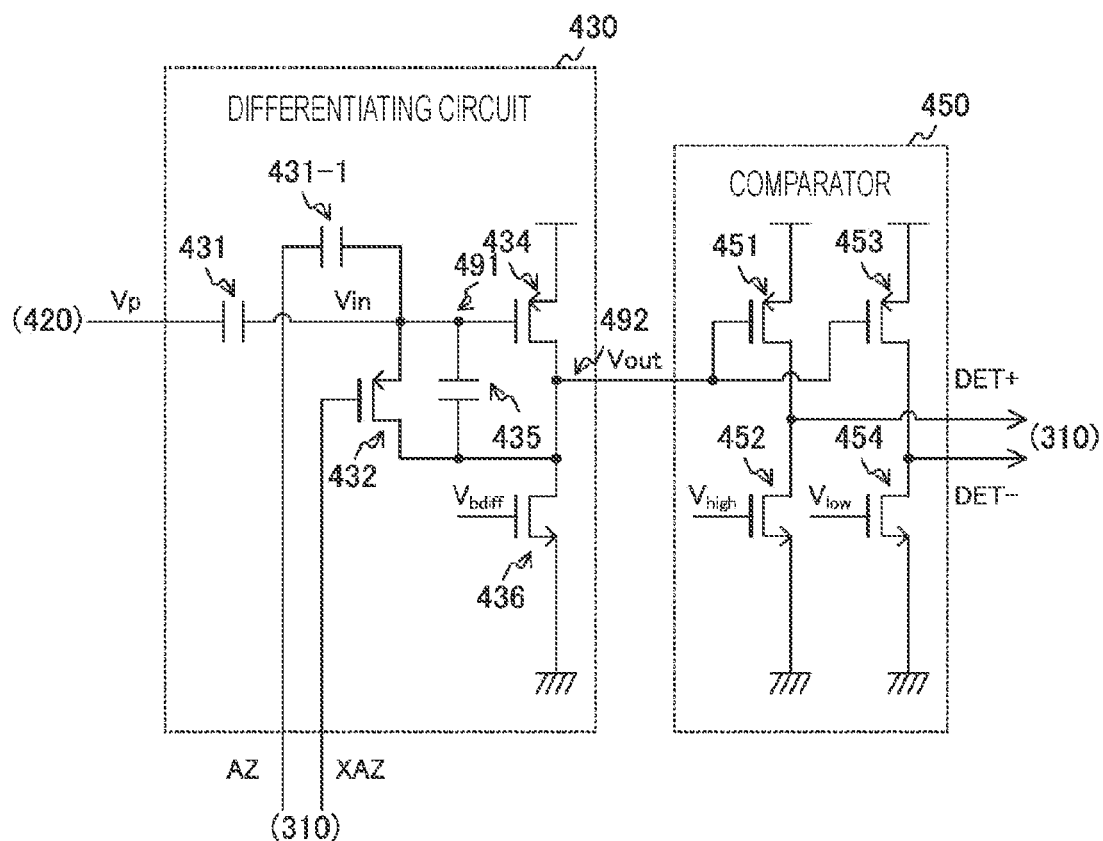
FIG. 18 is a circuit diagram illustrating a configuration example of a differentiating circuit using the capacitance and the comparator in the second embodiment of the present technology.

Note that the element (N-type transistor 433) that supplies a charge having the opposite polarity to the reset transistor (P-type transistor 432) is not limited to a MOS transistor as long as the element is a capacitive element. For example, the element may be a capacitive element such as a MOS capacitor. Alternatively, as illustrated in FIG. 17, the capacitance 435 can be eliminated. Further, as illustrated in FIG. 18, a capacitance 431-1 such as a capacitor can be arranged instead of the N-type transistor 433.

As described above, according to the second embodiment of the present technology, since the N-type transistor 433 is connected in series with the P-type transistor 432, the leakage current can be reduced as compared with the case where these transistors are connected in parallel.

3. Third Embodiment

In the first embodiment described above, the P-type transistor 432 and the N-type transistor 433 are in the off-state during the detection period, but there is a possibility that the leakage current flows in these transistors in the off-state and power consumption may increase. The differentiating circuit 430 of a third embodiment is different from that of the first embodiment in that a differential amplifier circuit is arranged to suppress the leakage current.

Figure 19:
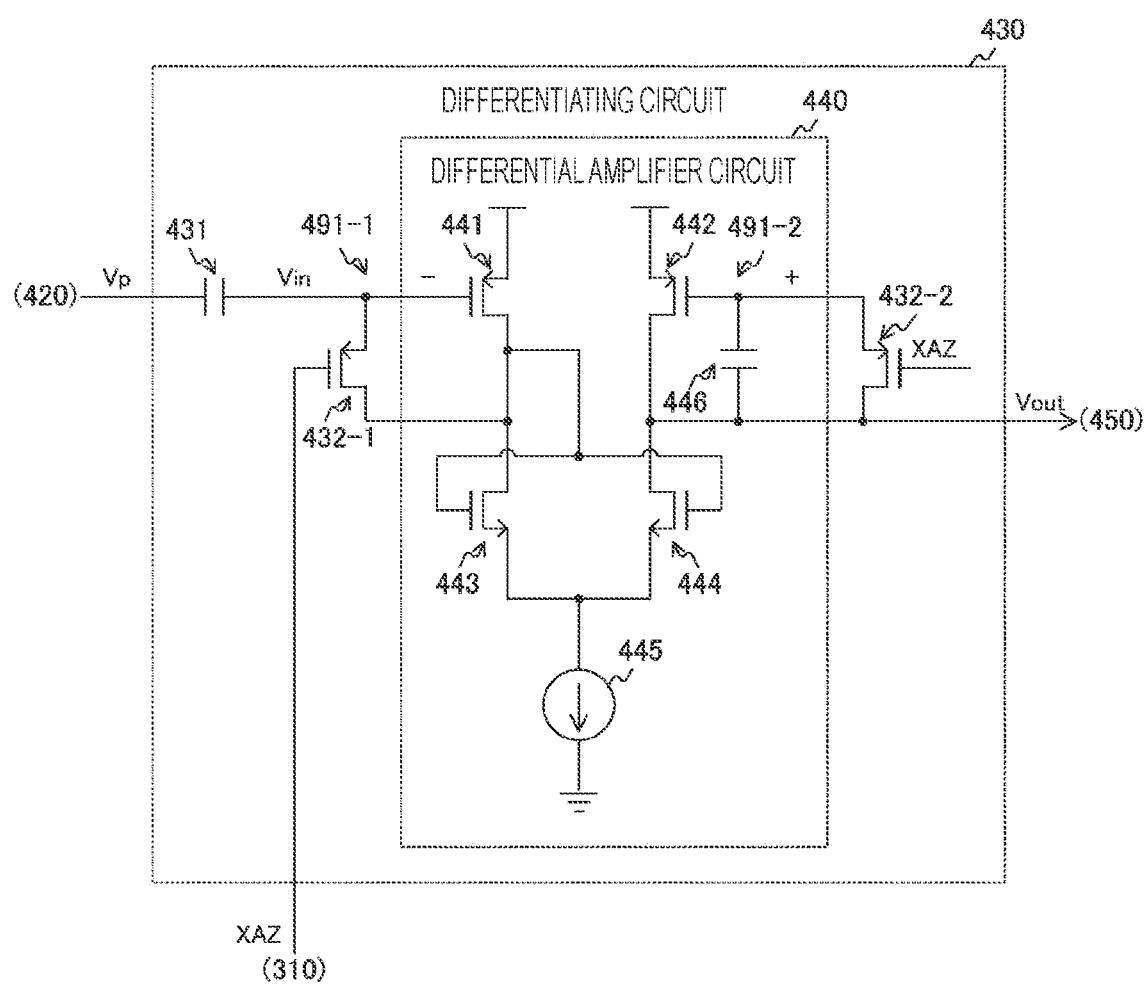
FIG. 19 is a circuit diagram illustrating a configuration example of a differentiating circuit in a third embodiment of the present technology.

FIG. 19 is a circuit diagram illustrating a configuration example of the differentiating circuit 430 in the third embodiment of the present technology. The differentiating circuit 430 of the third embodiment includes the capacitance 431, P-type transistors 432-1 and 432-2, and a differential amplifier circuit 440. Further, differential transistors 441 and 442, N-type transistors 443 and 444, a current source 445, and a capacitance 446 are arranged in the differential amplifier circuit 440. For example, MOS transistors are used as the P-type transistors 432-1 and 432-2. For example, P-type MOS transistors are used as the differential transistors 441 and 442. For example, MOS transistors are used as the N-type transistors 443 and 444.

In the differential amplifier circuit 440, the differential transistors 441 and 442 are connected in parallel to a power supply terminal. The gate of the differential transistor 441 is used as an inverting input terminal (−)491-1 of the differential amplifier circuit 440, and the gate of the differential transistor 442 is used as an inverting input terminal (+)491-2 of the differential amplifier circuit 440.

The gates of the N-type transistors 443 and 444 are commonly connected to a drain of the differential transistor 441. Further, the drain of the N-type transistor 443 is connected to a drain of the differential transistor 441, and the drain of the N-type transistor 444 is connected to a drain of the differential transistor 442. Furthermore, the connection point of the differential transistor 442 and the N-type transistor 444 is connected to the comparator 450, and the output voltage Vout is output from this connection point.

The current source 445 supplies a predetermined constant current, and is inserted between sources of the N-type transistors 443 and 444 and a reference terminal.

The capacitance 431 is inserted between the non-inverting input terminal (+)491-2 of the differential amplifier circuit 440 and the buffer 420. The capacitance 446 is inserted between a gate and a source of the differential transistor 442.

The P-type transistor 432-1 opens and closes the path between the gate, which is the input node of the differential transistor 441, and the drain, which is an output node, according to the control signal XAZ. The P-type transistor 432-2 opens and closes the path between the gate and the drain of the differential transistor 442 according to the control signal XAZ. Note that one of the P-type transistor 432-1 or 432-2 is an example of the reset transistor described in the claims, whereas the other one is an example of the charge supply transistor described in the claims.

With the connection configuration described above, the P-type transistors 432-1 and 432-2 initialize both the inverting input terminal (−)491-1 and the non-inverting input terminal (+)491-2 during the reset period. As a result, the differential amplifier circuit 440 outputs the output voltage Vout having an initial value corresponding to the common mode voltage at each of the inverting input terminal (−)491-1 and the non-inverting input terminal (+)491-2.

Figure 20:
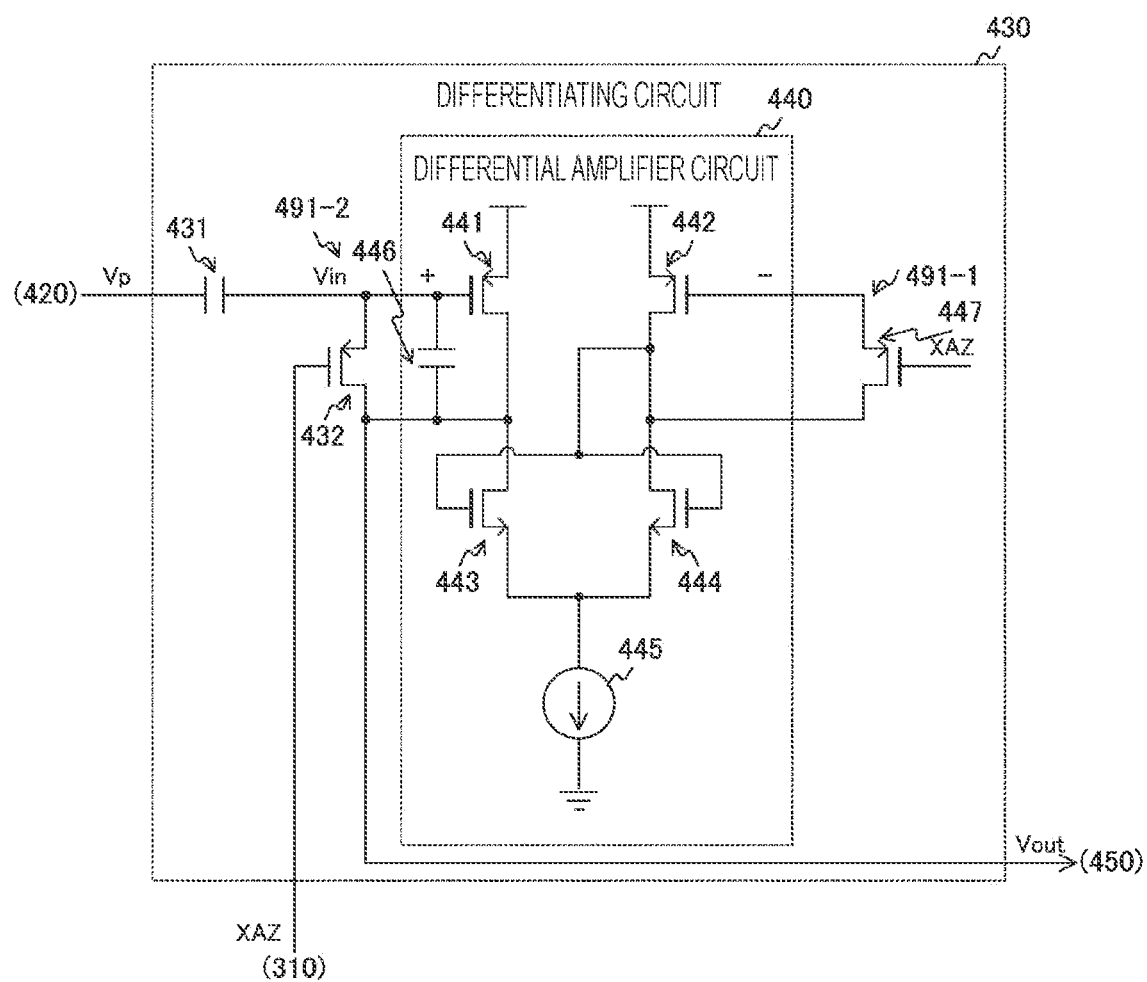
FIG. 20 is a circuit diagram illustrating a configuration example of a differentiating circuit in which the positive and negative of an input terminal are changed in the third embodiment of the present technology.
Figure 21:
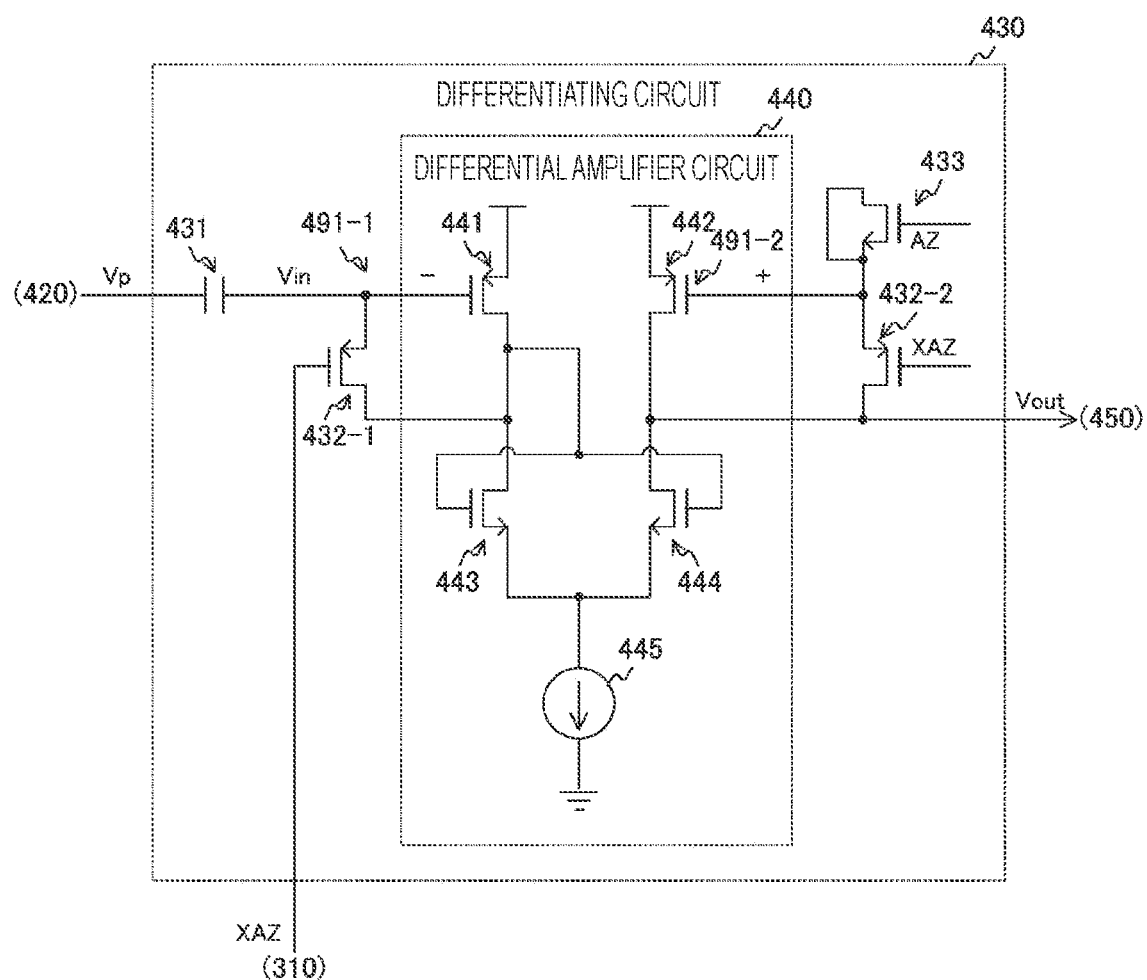
FIG. 21 is a circuit diagram illustrating a configuration example of a differentiating circuit with a capacitance eliminated in the third embodiment of the present technology.
Figure 22:
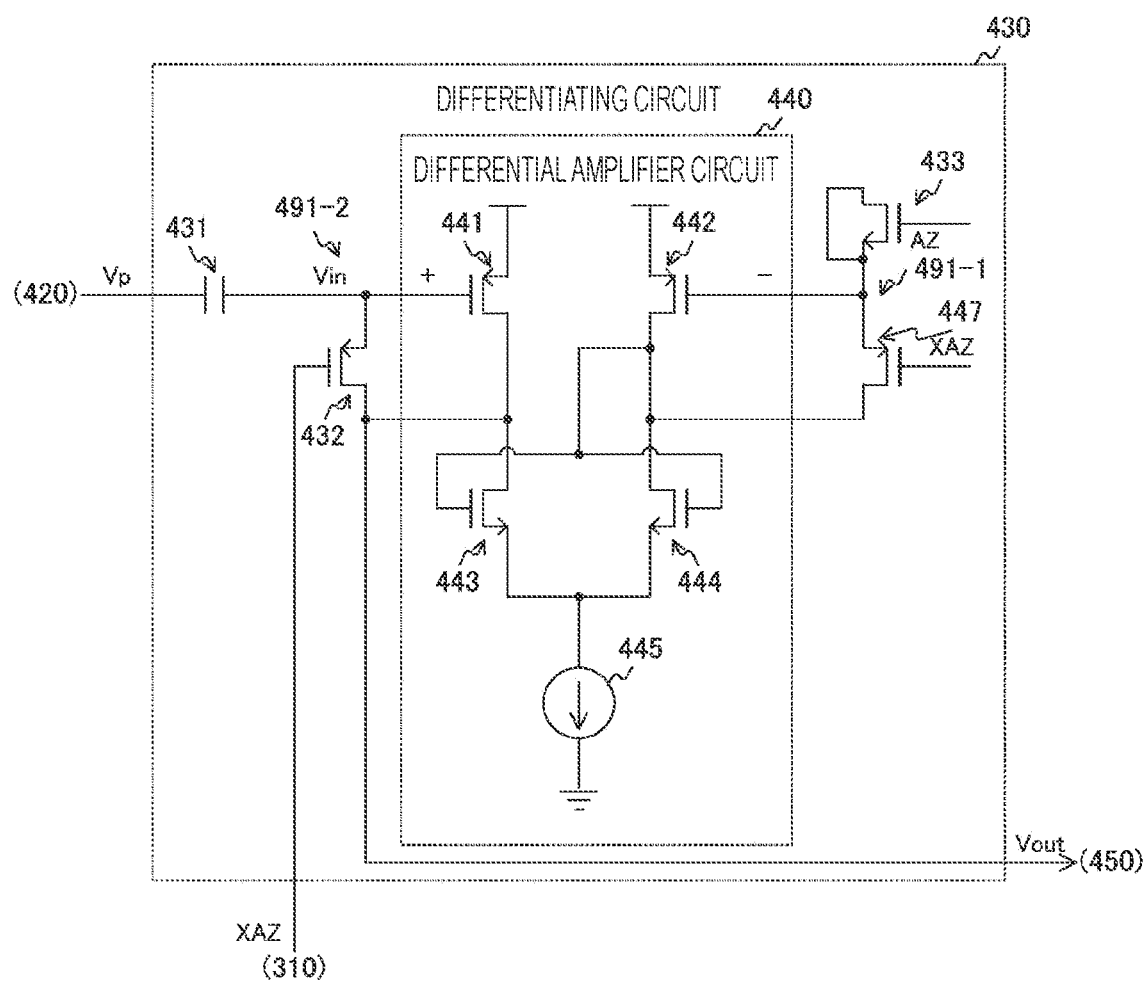
FIG. 22 is a circuit diagram illustrating a configuration example of a differentiating circuit in which the positive and negative of the input terminal are changed and the capacitance is eliminated in the third embodiment of the present technology.
Figure 23:
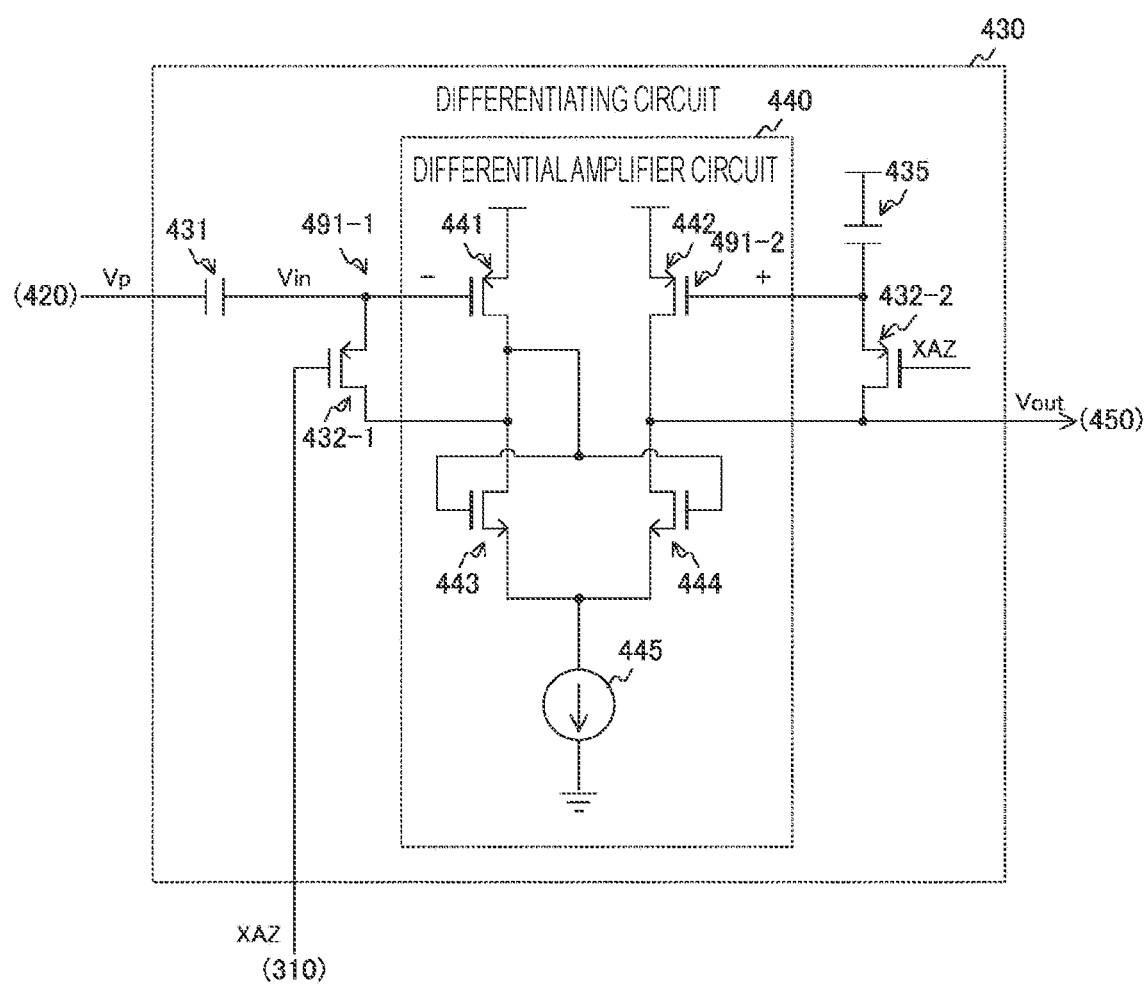
FIG. 23 is a circuit diagram illustrating a configuration example of a differentiating circuit to which a capacitive element is added and a comparator in the third embodiment of the present technology.

Note that the inverting input terminal (−)491-1 is connected to the capacitance 431, but the present technology is not limited to this configuration. As illustrated in FIG. 20, the non-inverting input terminal (+)491-2 can be connected to the capacitance 431, and the inverting input terminal (−)491-1 can be connected to an N-type transistor 447. Further, as illustrated in FIGS. 21 and 22, the capacitance 446 on a negative side may be eliminated in the configurations of FIGS. 19 and 20. In this case, a capacitive element (such as N-type transistor 443 with short-circuited source and drain) can be connected in series with the N-type transistors 432-2 and 447. Furthermore, in the configuration of FIG. 21, a capacitor can be connected as a capacitive element instead of the transistor, as illustrated in FIG. 23. Similarly, a capacitor can be used as a capacitive element in FIG. 22.

As described above, according to the third embodiment of the present technology, since the P-type transistors 432-1 and 432-2 are connected to the input terminal of the differential amplifier circuit 440, the voltage variation at the time of switching of these transistors can be suppressed.

4. Fourth Embodiment

In the first embodiment described above, the inversion timing of the control signal AZ needs to match the inversion timing of the control signal XAZ, but there is a possibility that the inversion timing may be shifted due to various factors. The differentiating circuit 430 of a fourth embodiment is different from that of the first embodiment in that the N-type transistor 433 is arranged at an output terminal to allow a delay in the inversion timing of the control signal XAZ.

Figure 24:
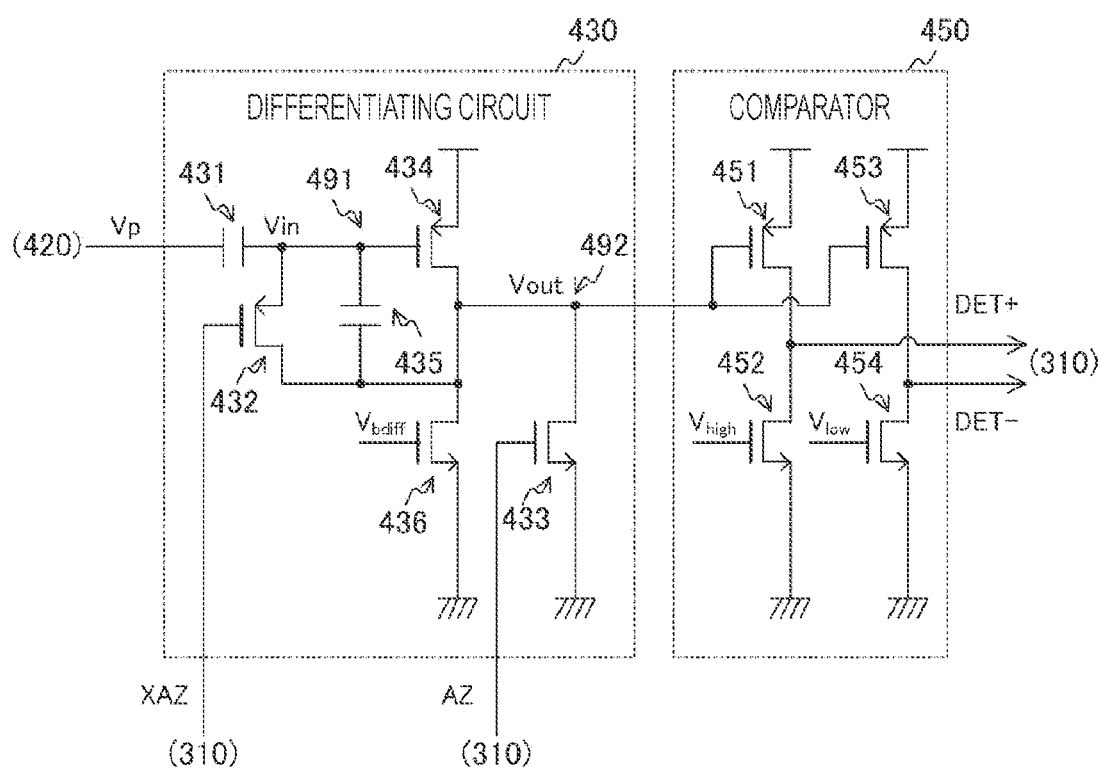
FIG. 24 is a circuit diagram illustrating a configuration example of a differentiating circuit and a comparator in a fourth embodiment of the present technology.

FIG. 24 is a circuit diagram illustrating a configuration example of the differentiating circuit 430 and the comparator 450 in the fourth embodiment of the present technology. The differentiating circuit 430 of the fourth embodiment is different from that of the first embodiment in that the N-type transistor 433 is inserted between the output terminal 492 and a reference terminal.

Here, a saturated drain current $I_D$ of the P-type transistor 434 used for amplification is expressed by the following equation.

$$|I_D| = \frac{1}{2} u_P C_{OXP} \frac{W_P}{L_P} (V_{GSP} - V_{th})^2 (1 + \lambda_P V_{DSP}) \quad \text{[Formula 1]}$$

In the above equation, $u_P$ denotes carrier mobility, and the unit is, for example, volt second per square meter (m²/Vs). $C_{oxp}$ denotes the oxide film capacitance of the P-type transistor 434, and the unit is, for example, Farad (F). $W_P$ denotes a gate width and the unit is, for example, meter (m). $L_P$ denotes a gate length and the unit is, for example, meter (m). $V_{GSP}$ denotes a gate-source voltage, and the unit is, for example, volt (V). Vth denotes the threshold voltage of a transistor, and the unit is, for example, volt (V). $\lambda_P$ denotes a predetermined coefficient. $V_{DSP}$ denotes a drain-source voltage, and the unit is, for example, volt (V).

Due to the feedthrough when the P-type transistor 432 shifts from the on-state to the off state as in the first embodiment, the initial value of the output voltage Vout may decrease from the design value (Vr). In this case, the N-type transistor 433 supplies a negative charge to the output terminal 492. The drain current $I_D$ of the P-type transistor 434 thus decreases. From the above equation, in a case where the drain current $I_D$ decreases, the gate-source voltage $V_{GSP}$ also decreases, and the voltage at the output terminal 492 connected to the source rises. Consequently, it is possible to suppress the voltage variation in the output voltage Vout due to the feedthrough.

Note that the P-type transistor 432 is connected to the input side of an inverting circuit and the N-type transistor 433 is connected to the output side of the inverting circuit, but the present technology is not limited to this configuration. Conversely, the P-type transistor 432 can be connected to the output side of the inverting circuit, and the N-type transistor 433 may be connected to the input side of the inverting circuit.

Figure 25A:
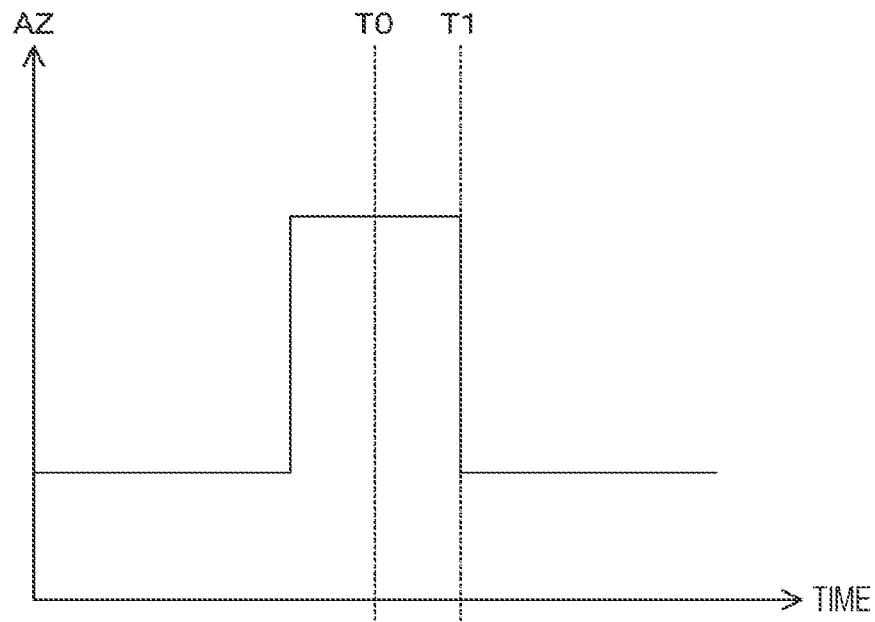
FIGS. 25A and 25B are timing charts illustrating an example of a change in control signal in the fourth embodiment of the present technology.
Figure 25B:
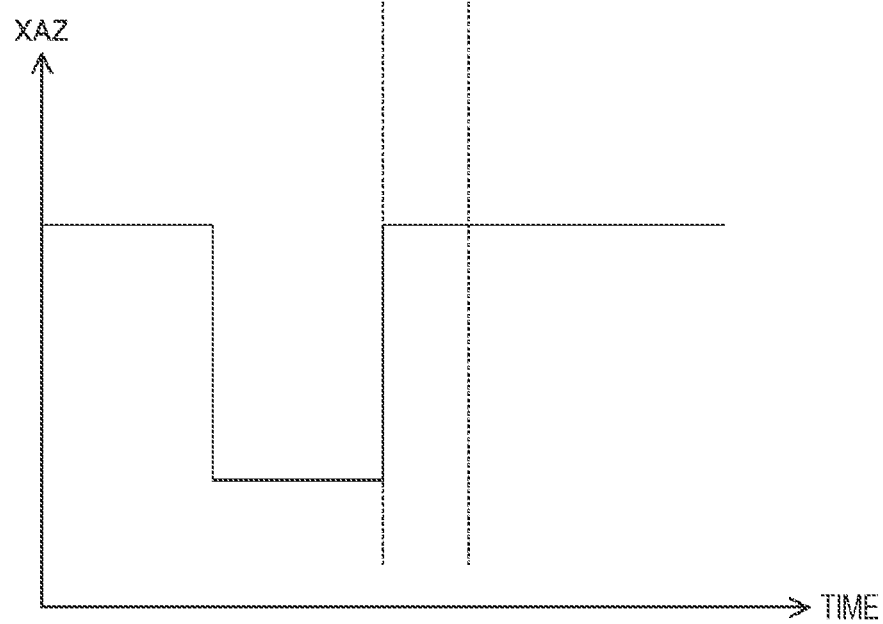

FIGS. 25A and 25B are timing charts illustrating an example of a change in control signal in the fourth embodiment of the present technology. FIG. 25A is a timing chart illustrating an example of a change in the control signal AZ, and FIG. 25B is a timing chart illustrating an example of a change in the control signal XAZ.

As illustrated in FIG. 24, the P-type transistor 432 is connected to the input side of the inverting circuit, while the N-type transistor 433 is connected to the output side of the inverting circuit. For this reason, in view of the delay time of the inverting circuit, it is desirable that the timing of inverting the control signal AZ to the N-type transistor 433 is later than the timing of inverting the control signal XAZ to the P-type transistor 432. Consequently, for example, the transfer unit 310 inverts (in other words, delays) the control signal XAZ by an inverter or the like to generate the control signal AZ.

As a result, as illustrated in FIGS. 25A and 25B, the timing T1 when the control signal AZ is inverted from a high level to a low level is delayed with respect to the timing T0 when the control signal XAZ is inverted from a low level to a high level. In other words, unlike the first embodiment, the inversion timing of the control signal AZ does not need to substantially match the inversion timing of the control signal XAZ.

Figure 26:
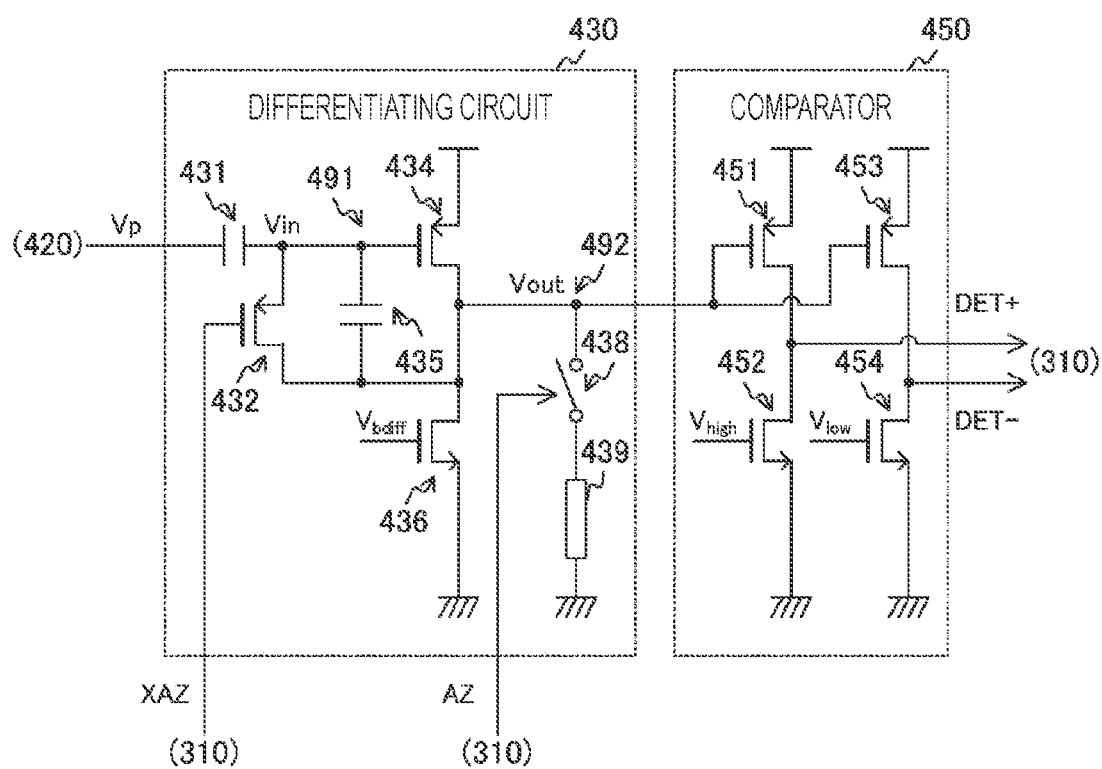

Note that, as illustrated in FIG. 26, a resistor 438 and a switch 439 may be arranged instead of the N-type transistor 433. In this configuration, the resistor 439 is inserted between the switch 438 and a reference terminal. The switch 438 opens and closes the path between the resistor 439 and the output terminal 492 according to the control signal AZ.

Figure 27:
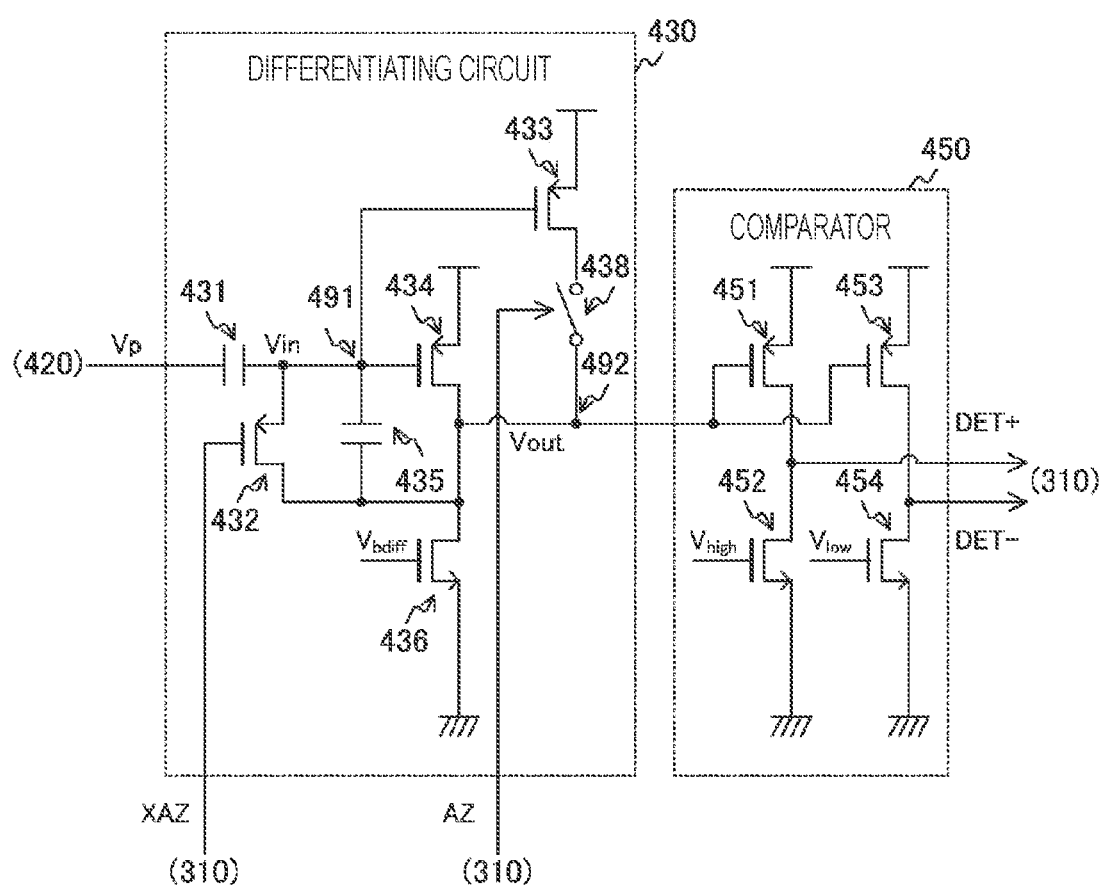

Further, as illustrated in FIG. 27, the N-type transistor 433 may be arranged on the power supply side. In this configuration, the N-type transistor 433 is inserted between a power supply terminal and the switch 438, and its gate is connected to the input terminal 491. The switch 438 opens and closes the path between the N-type transistor 433 and the output terminal 492 according to the control signal AZ.

As described above, according to the fourth embodiment of the present technology, since the P-type transistor 432 is connected to the input terminal and the N-type transistor 433 is connected to the output terminal, the timing of inverting the control signal AZ does not need to substantially match the timing of inverting the control signal XAZ. As a result, the voltage variation at the time of switching can be suppressed even in a case where the timing of inverting the control signal AZ does not substantially match the timing of inverting the control signal XAZ.

[Image Capturing Device of Fifth Embodiment (Scan Type)]

The image capturing device 20 of the first embodiment described above is an asynchronous image capturing device that reads events with an asynchronous reading system. However, the event reading system is not limited to the asynchronous reading system, and may be a synchronous reading system. The image capturing device to which the synchronous reading system is applied is a scan-type image capturing device like a normal image capturing device that captures an image at a predetermined frame rate.

Figure 28:
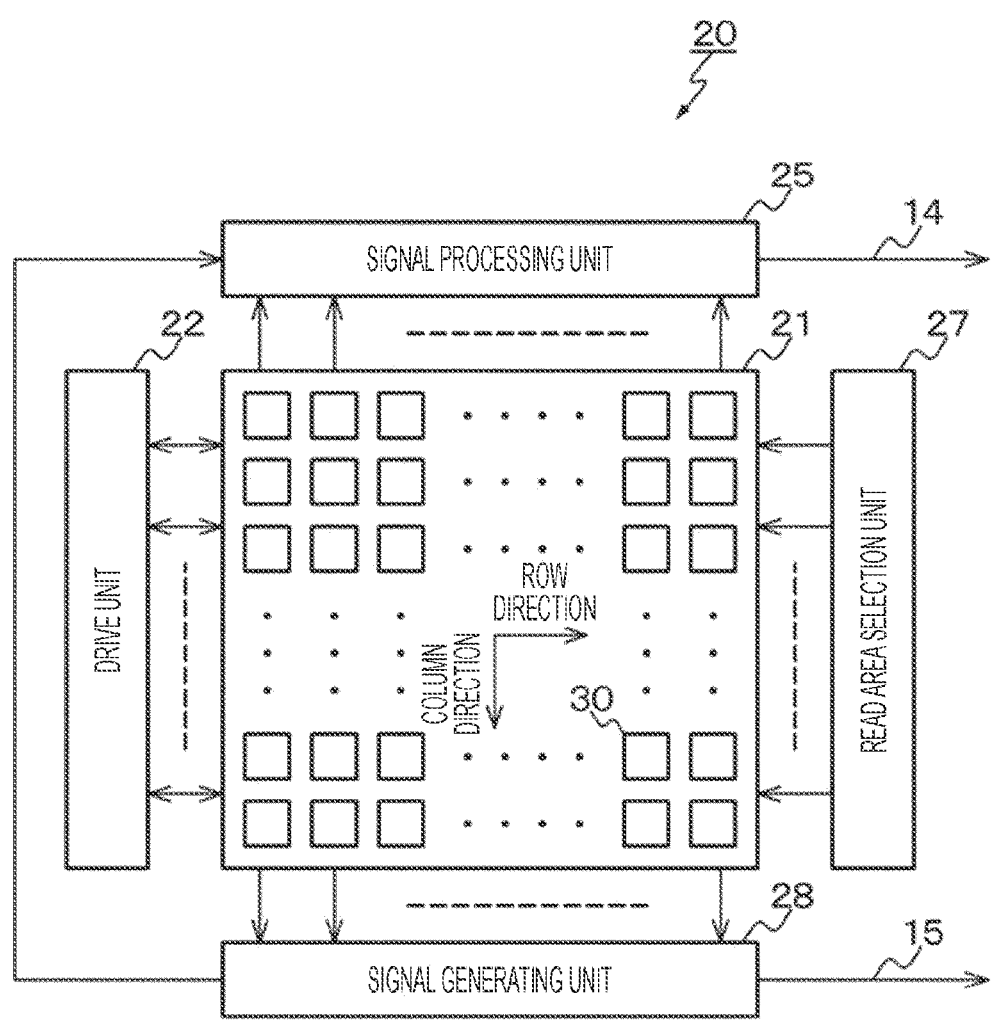

FIG. 28 is a block diagram illustrating a configuration example of an image capturing device of the fifth embodiment, that is, a scan-type image capturing device, which is used as the image capturing device 20 in the image capturing system 10 to which the technique according to the present disclosure is applied.

As illustrated in FIG. 28, the image capturing device 20 of the fifth embodiment, which functions as the image capturing device of the present disclosure, includes a pixel array unit 21, a drive unit 22, a signal processing unit 25, a read area selection unit 27, and a signal generating unit 28.

The pixel array unit 21 includes a plurality of pixels 30. The plurality of pixels 30 outputs an output signal in response to a selection signal from the read area selection unit 27. The configuration of each of the plurality of pixels 30 is similar to that of the pixel 300 illustrated in FIG. 4. The plurality of pixels 30 outputs an output signal corresponding to the amount of variation in light intensity. As illustrated in FIG. 28, the plurality of pixels 30 may be two-dimensionally arranged in a matrix.

The drive unit 22 drives each of the plurality of pixels 30 and causes the signal processing unit 25 to output a pixel signal generated in each pixel 30. Note that the drive unit 22 and the signal processing unit 25 are circuit units for acquiring gradation information. Consequently, in a case where only the event information is acquired, the drive unit 22 and the signal processing unit 25 may be omitted.

The read area selection unit 27 selects a part of the plurality of pixels 30 included in the pixel array unit 21. Specifically, the read area selection unit 27 determines a selected area in response to a request from each pixel 30 of the pixel array unit 21. For example, the read area selection unit 27 selects any one or a plurality of rows included in the structure of a two-dimensional matrix corresponding to the pixel array unit 21. The read area selection unit 27 sequentially selects one or a plurality of rows according to a preset cycle. Further, the read area selection unit 27 may determine a selected area in response to a request from each pixel 30 of the pixel array unit 21.

The signal generating unit 28 generates an event signal corresponding to an active pixel of the selected pixels in which an event is detected, on the basis of the output signal of a pixel selected by the read area selection unit 27. The event is an event in which the intensity of light changes. The active pixel is a pixel in which the amount of variation in light intensity corresponding to the output signal exceeds or is lower than a preset threshold value. For example, the signal generating unit 28 compares the output signal of a pixel with a reference signal, detects an active pixel that outputs the output signal in a case where the output signal is larger or smaller than the reference signal, and generates an event signal corresponding to the active pixel.

The signal generating unit 28 can include, for example, a column selection circuit that arbitrates a signal entering the signal generating unit 28. Further, the signal generating unit 28 can be configured to output not only the information of the active pixel in which the event is detected, but also the information of an inactive pixel in which the event is not detected.

The signal generating unit 28 outputs the address information and time stamp information (for example, (X, Y, T)) of the active pixel in which the event is detected, through an output line 15. However, the data output from the signal generating unit 28 may be not only the address information and the time stamp information but also frame format information (for example, (0,0,1,0, . . . )).

6. Example of Application to Moving Body

The technology according to the present disclosure (present technology) can be applied to various products. For example, the technology according to the present disclosure may be achieved as a device mounted on any type of moving bodies such as an automobile, an electric vehicle, a hybrid electric vehicle, a motorcycle, a bicycle, personal mobility, an airplane, a drone, a ship, and a robot.

Figure 29:
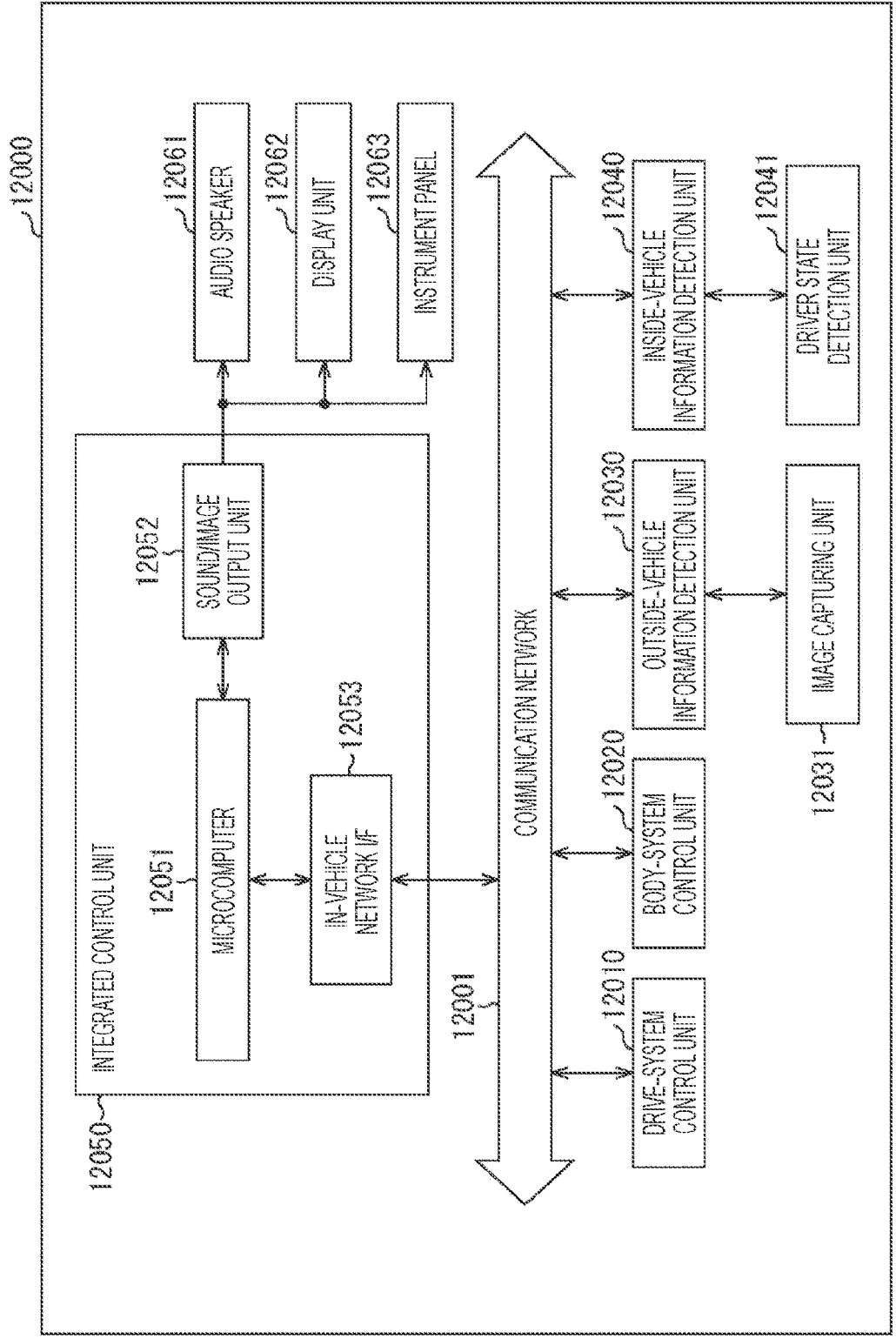

FIG. 29 is a block diagram illustrating a schematic configuration example of a vehicle control system that is an example of a moving body control system to which the technology according to the present disclosure can be applied.

A vehicle control system 12000 includes a plurality of electronic control units connected to each other via a communication network 12001. In the example illustrated in FIG. 29, the vehicle control system 12000 includes a drive-system control unit 12010, a body-system control unit 12020, an outside-vehicle information detection unit 12030, an inside-vehicle information detection unit 12040, and an integrated control unit 12050. Further, as a functional configuration of the integrated control unit 12050, a microcomputer 12051, a sound/image output unit 12052, and an in-vehicle network interface (I/F) 12053 are illustrated.

The drive-system control unit 12010 controls the operation of devices related to the drive system of a vehicle according to various programs. For example, the drive-system control unit 12010 functions as a drive force generation device for generating a drive force of a vehicle such as an internal combustion engine or a drive motor, a drive force transmission mechanism for transmitting a drive force to wheels, a steering mechanism for adjusting the steering angle of a vehicle, and a control device such as a braking device for generating a braking force of a vehicle.

The body-system control unit 12020 controls the operation of various devices mounted on a vehicle body according to various programs. For example, the body-system control unit 12020 functions as a keyless entry system, a smart key system, a power window device, or a control device for various lamps such as a head lamp, a back lamp, a brake lamp, a winker, and a fog lamp. In this case, radio waves transmitted from portable devices that substitute for a key or signals from various switches may be input to the body-system control unit 12020. The body-system control unit 12020 receives the input of these radio waves or signals, and controls a vehicle door lock device, a power window device, a lamp, and the like.

The outside-vehicle information detection unit 12030 detects information outside a vehicle in which the vehicle control system 12000 is incorporated. For example, an image capturing unit 12031 is connected to the outside-vehicle information detection unit 12030. The outside-vehicle information detection unit 12030 causes the image capturing unit 12031 to capture an image of the outside of the vehicle, and receives the captured image. The outside-vehicle information detection unit 12030 may perform an object detection process or a distance detection process on people, vehicles, obstacles, signs, characters on road surfaces, or the like, on the basis of the received image.

The image capturing unit 12031 is an optical sensor that receives light and outputs an electrical signal according to the amount of received light. The image capturing unit 12031 can output an electric signal as an image and also as distance measurement information. Further, the light received by the image capturing unit 12031 may be visible light or invisible light such as infrared light.

The inside-vehicle information detection unit 12040 detects information inside a vehicle. For example, a driver state detection unit 12041 that detects the state of a driver is connected to the inside-vehicle information detection unit 12040. The driver state detection unit 12041 includes, for example, a camera that captures images of the driver, and the inside-vehicle information detection unit 12040 may calculate the degree of fatigue or concentration of the driver, or may determine whether or not the driver is asleep, on the basis of the detection information input from the driver state detection unit 12041.

The microcomputer 12051 can calculate the control target value of a drive force generation device, a steering mechanism, or a braking device on the basis of the information inside and outside a vehicle, which is acquired by the outside-vehicle information detection unit 12030 or the inside-vehicle information detection unit 12040, and output a control command to the drive-system control unit 12010. For example, the microcomputer 12051 can execute cooperative control for the purpose of achieving the functions of advanced driver assistance system (ADAS) including collision avoidance or shock mitigation of vehicles, follow-up traveling based on an inter-vehicle distance, vehicle speed maintenance traveling, vehicle collision warning, or vehicle lane departure warning.

Furthermore, the microcomputer 12051 can control the drive force generation device, the steering mechanism, the braking device, or the like on the basis of the information around a vehicle, which is acquired by the outside-vehicle information detection unit 12030 or the inside-vehicle information detection unit 12040, to execute cooperative control for the purpose of autonomous driving or the like in which a vehicle autonomously travels without depending on a driver's operation.

Further, the microcomputer 12051 can output a control command to the body-system control unit 12020 on the basis of the information outside the vehicle acquired by the outside-vehicle information detection unit 12030. For example, the microcomputer 12051 can control headlamps according to the position of a preceding vehicle or an oncoming vehicle detected by the outside-vehicle information detection unit 12030, to execute cooperative control for the purpose of an antiglare process such as switching a high beam to a low beam.

The sound/image output unit 12052 transmits an output signal of at least one of a sound or an image to an output device capable of visually or audibly notifying an occupant of a vehicle or the outside of the vehicle of information. In the example illustrated in FIG. 29, an audio speaker 12061, a display unit 12062, and an instrument panel 12063 are illustrated as output devices. The display unit 12062 may include at least one of an onboard display or a head-up display, for example.

Figure 30:
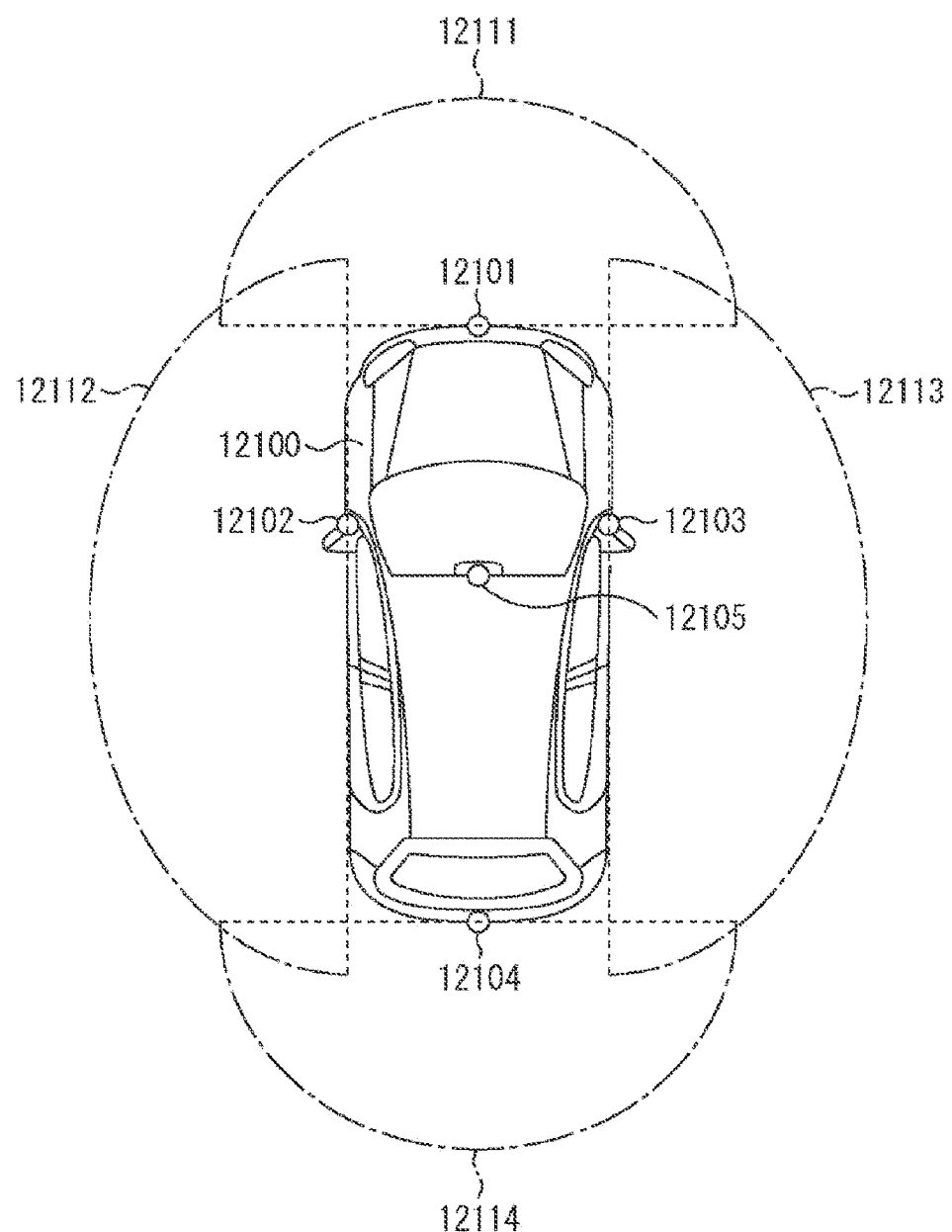

FIG. 30 is a diagram illustrating an example of installation positions of the image capturing unit 12031.

In FIG. 30, image capturing units 12101, 12102, 12103, 12104, and 12105 are illustrated as the image capturing unit 12031.

The image capturing units 12101, 12102, 12103, 12104, and 12105 are provided, for example, at positions such as the front nose, side mirrors, rear bumper, and back door of the vehicle 12100, and the upper portion of a windshield inside the vehicle. The image capturing unit 12101 provided on the front nose and the image capturing unit 12105 provided on the upper portion of the windshield inside the vehicle mainly acquire images in front of the vehicle 12100. The image capturing units 12102 and 12103 provided on the side mirrors mainly acquire images of the side of the vehicle 12100. The image capturing unit 12104 provided on the rear bumper or the back door mainly acquires images behind the vehicle 12100. The image capturing unit 12105 provided on the upper portion of the windshield inside the vehicle is mainly used for detecting a preceding vehicle, a pedestrian, an obstacle, a traffic signal, a traffic sign, a lane, or the like.

Note that FIG. 29 illustrates an example of image capturing ranges of the image capturing units 12101 to 12104. An image capturing range 12111 indicates the image capturing range of the image capturing unit 12101 provided on the front nose, image capturing ranges 12112 and 12113 respectively indicate the image capturing ranges of the image capturing units 12102 and 12103 provided on the side mirrors, and an image capturing range 12114 indicates the image capturing range of the image capturing unit 12104 provided on the rear bumper or the back door. For example, by superimposing pieces of the image data captured by the image capturing units 12101 to 12104, a bird's-eye view image of the vehicle 12100 viewed from above can be obtained.

At least one of the image capturing units 12101 to 12104 may have a function of acquiring distance information. For example, at least one of the image capturing units 12101 to 12104 may be a stereo camera including a plurality of image capturing elements or may be an image capturing element having pixels for phase difference detection.

For example, the microcomputer 12051 can calculate the distance to each three-dimensional object in the image capturing ranges 12111 to 12114 and the temporal change of this distance (relative speed to vehicle 12100) on the basis of the distance information obtained from the image capturing units 12101 to 12104 to extract a three-dimensional object that is closest to the vehicle 12100 on the traveling path of the vehicle 12100 and is traveling at a predetermined speed (for example, 0 km/h or higher) in substantially the same direction as the vehicle 12100 as a preceding vehicle. Further, the microcomputer 12051 can set an inter-vehicle distance to the preceding vehicle, the distance being to be secured in advance, and can execute automatic brake control (including follow-up stop control), automatic acceleration control (including follow-up start control), and the like. In this way, it is possible to execute cooperative control for the purpose of autonomous driving in which a vehicle autonomously travels without depending on a driver's operation, or the like.

For example, the microcomputer 12051 can classify three-dimensional object data regarding the three-dimensional object into two-wheeled vehicles, ordinary vehicles, large vehicles, pedestrians, telephone poles and other three-dimensional objects and extract the three-dimensional object data on the basis of the distance information obtained from the image capturing units 12101 to 12104, and use the extracted data for automatic avoidance of obstacles. For example, the microcomputer 12051 distinguishes obstacles around the vehicle 12100 into obstacles visible to the driver of the vehicle 12100 and obstacles difficult for the driver to visually recognize. Then, the microcomputer 12051 determines the collision risk indicating the risk of collision with each obstacle, and in a case where the collision risk is equal to or more than a set value and there is a possibility of collision, the microcomputer 12051 can output an alarm to the driver through the audio speaker 12061 and the display unit 12062, or can perform forced deceleration or avoidance steering through the drive-system control unit 12010 to perform driving assistance to avoid collisions.

At least one of the image capturing units 12101 to 12104, may be an infrared camera that detects infrared rays. For example, the microcomputer 12051 can determine whether or not a pedestrian is present in images captured by the image capturing units 12101 to 12104 to recognize the pedestrian. Such pedestrian recognition is performed by, for example, a procedure of extracting feature points in images captured by the image capturing units 12101 to 12104 functioning as infrared cameras and a procedure of performing a pattern matching process on a series of feature points indicating the outline of an object to determine whether or not the object is a pedestrian. In a case where the microcomputer 12051 determines that a pedestrian is present in the images captured by the image capturing units 12101 to 12104 and recognizes the pedestrian, the sound/image output unit 12052 controls the display unit 12062 to superimpose a rectangular outline for emphasis on the recognized pedestrian for display. Alternatively, the sound/image output unit 12052 may control the display unit 12062 to display an icon indicating a pedestrian or the like at a desired position.

An example of the vehicle control system to which the technology according to the present disclosure can be applied has been described above. The technology according to the present disclosure can be applied to, for example, the image capturing unit 12031 among the configurations described above. Specifically, the image capturing device 100 of FIG. 1 can be applied to the image capturing unit 12031. As the technology according to the present disclosure is applied to the image capturing unit 12031, the detection accuracy of an address event can be improved, so that the safety of the system can be improved.

Note that the embodiments described above are an example for embodying the present technology, and the matters in the embodiments have a correspondent relationship with the matters specifying the invention in the claims. Similarly, the matters specifying the invention in the claims have a correspondent relationship with the matters in the embodiments of the present technology, the matters having the same name as the matters specifying the invention in the claims. However, the present technology is not limited to the embodiments and can be embodied by making various modifications to the embodiments without departing from the gist of the present technology.

Further, the processing procedure described in the above embodiments may be regarded as a method having these series of procedures, or as a program for causing a computer to execute the series of procedures or a recording medium storing the program. As this recording medium, for example, a compact disc (CD), a mini disc (MD), a digital versatile disc (DVD), a memory card, a Blu-ray disc (Blu-ray (registered trademark) Disc), or the like can be used.

Note that the effects described in the present specification are merely examples and are not limited, and other effects may be obtained.

Note that the present technology can also have the following configurations.

(1) An electronic circuit including:
a capacitance that supplies a charge corresponding to an amount of variation in a predetermined pixel voltage to a predetermined input terminal;
a voltage output unit that outputs, as an output voltage, a voltage corresponding to an input voltage at the input terminal from a predetermined output terminal;

a reset transistor that supplies one of a positive charge or a negative charge during a predetermined period to control the output voltage to an initial value in a case where initialization is instructed; and a charge supply unit that supplies the other of the positive charge or the negative charge when the predetermined period elapses.

(2) The electronic circuit according to (1) described above, in which the voltage output unit includes an inverting circuit, and the reset transistor is inserted between the input terminal and the output terminal.

(3) The electronic circuit according to (2) described above, in which the charge supply unit is connected to the input terminal.

(4) The electronic circuit according to (2) described above, in which is inserted between the output terminal and a predetermined terminal.

(5) The electronic circuit according to (2) described above, in which the charge supply unit includes a charge supply transistor inserted between the input terminal and the output terminal.

(6) The electronic circuit according to (5) described above, in which a predetermined number of the reset transistors are connected in parallel between the input terminal and the output terminal.

(7) The electronic circuit according to (5) described above, in which a predetermined number of the charge supply transistors are connected in parallel between the input terminal and the output terminal.

(8) The electronic circuit according to (5) described above, in which a predetermined number of the reset transistors are connected in series between the input terminal and the output terminal.

(9) The electronic circuit according to (5) described above, in which a predetermined number of the charge supply transistors are connected in series between the input terminal and the output terminal.

(10) The electronic circuit according to (1), in which the voltage output unit includes a differential amplifier circuit including a pair of differential transistors, the reset transistor is inserted between an input node and an output node of one of the pair of differential transistors, and the charge supply unit is connected to an input node of the other of the pair of differential transistors.

(11) The electronic circuit according to (10), in which the charge supply unit includes a charge supply transistor that is inserted between the input node and an output node of the other of the pair of differential transistors, and a capacitive element that is connected to the charge supply transistor.

(11) A solid-state image sensor including:

a current-voltage conversion unit that converts a photocurrent into a voltage and supplies the voltage as a pixel voltage;

a capacitance that supplies a charge corresponding to an amount of variation in the pixel voltage to a predetermined input terminal;

a voltage output unit that outputs, as an output voltage, a voltage corresponding to an input voltage at the input terminal from a predetermined output terminal;

a reset transistor that supplies one of a positive charge or a negative charge during a predetermined period to control the output voltage to an initial value in a case where initialization is instructed;

a charge supply unit that supplies the other of the positive charge or the negative charge when the predetermined period elapses; and a comparator that compares the output voltage with a predetermined threshold value.

(12) A method of controlling an electronic circuit including:

a voltage output procedure of outputting, as an output voltage, a voltage corresponding to an input voltage at an input terminal to which a charge corresponding to an amount of variation in a predetermined pixel voltage is supplied from a capacitance, from a predetermined output terminal;

a reset procedure in which a reset transistor supplies one of a positive charge or a negative charge during a predetermined period to control the output voltage to an initial value in a case where initialization is instructed; and a charge supply procedure in which a charge supply unit supplies the other of the positive charge or the negative charge when the predetermined period elapses.

REFERENCE SIGNS LIST

100 Image capturing device
110 Imaging lens
120 Recording unit
130 Control unit
200 Solid-state image sensor
201 Light receiving chip
202 Circuit chip
212 Signal processing unit
213 Arbiter
214 Pixel array unit
300 Pixel
310 Transfer unit
410 Logarithmic response unit
411 Photoelectric conversion element
412, 415, 433, 436, 443, 444, 452, 454 N-type transistor
413, 431, 431-1, 435, 446 Capacitance
414, 421, 422, 432, 434, 451, 453 P-type transistor
416 Current-voltage conversion unit
420 Buffer
430 Differentiating circuit
437 Inverting circuit
438 Switch
439 Resistor
440 Differential amplifier circuit
441, 442 Differential transistor
445 Current source
450 Comparator
12031 Image capturing unit

The invention claimed is:

1. An electronic circuit, comprising:

a capacitance configured to supply a charge corresponding to an amount of variation in a predetermined pixel voltage to a predetermined input terminal;

a voltage output unit configured to output, as an output voltage, a voltage corresponding to an input voltage at the predetermined input terminal from a predetermined output terminal;

a reset transistor configured to supply one of a positive charge or a negative charge during a predetermined period to control the output voltage to an initial value in a case where initialization is instructed; and a charge supply unit configured to supply another of the positive charge or the negative charge when the predetermined period elapses.

2. The electronic circuit according to claim 1, wherein the voltage output unit includes an inverting circuit, and
the reset transistor is between the predetermined input terminal and the predetermined output terminal.

3. The electronic circuit according to claim 2, wherein the charge supply unit is connected to the predetermined input terminal.

4. The electronic circuit according to claim 2, wherein the charge supply unit is between the predetermined output terminal and a predetermined terminal.

5. The electronic circuit according to claim 2, wherein the charge supply unit includes a charge supply transistor which is between the predetermined input terminal and the predetermined output terminal.

6. The electronic circuit according to claim 5, wherein a predetermined number of the reset transistors are connected in parallel between the predetermined input terminal and the predetermined output terminal.

7. The electronic circuit according to claim 5, wherein a predetermined number of the charge supply transistors are connected in parallel between the predetermined input terminal and the predetermined output terminal.

8. The electronic circuit according to claim 5, wherein a predetermined number of the reset transistors are connected in series between the predetermined input terminal and the predetermined output terminal.

9. The electronic circuit according to claim 5, wherein a predetermined number of the charge supply transistors are connected in series between the predetermined input terminal and the predetermined output terminal.

10. The electronic circuit according to claim 1, wherein the voltage output unit includes a differential amplifier circuit including a pair of differential transistors,
the reset transistor is between an input node and an output node of one of the pair of differential transistors, and
the charge supply unit is connected to an input node of another of the pair of differential transistors.

11. The electronic circuit according to claim 10, wherein the charge supply unit includes a charge supply transistor between the input node and an output node of the another of the pair of differential transistors, and
a capacitive element connected to the charge supply transistor.

12. A solid-state image sensor, comprising:
a current-voltage conversion unit configured to:
converts a photocurrent into a voltage; and
supply the voltage as a pixel voltage;
a capacitance configured to supply a charge corresponding to an amount of variation in the pixel voltage to a predetermined input terminal;
a voltage output unit configured to output, as an output voltage, a voltage corresponding to an input voltage at the predetermined input terminal from a predetermined output terminal;
a reset transistor configured to supply one of a positive charge or a negative charge during a predetermined period to control the output voltage to an initial value in a case where initialization is instructed;
a charge supply unit configured to supply another of the positive charge or the negative charge when the predetermined period elapses; and
a comparator configured to compare the output voltage with a predetermined threshold value.

13. A method of controlling an electronic circuit, comprising:
a voltage output procedure of outputting, as an output voltage, a voltage corresponding to an input voltage at an input terminal to which a charge corresponding to an amount of variation in a predetermined pixel voltage is supplied from a capacitance, from a predetermined output terminal;
a reset procedure in which a reset transistor supplies one of a positive charge or a negative charge during a predetermined period to control the output voltage to an initial value in a case where initialization is instructed; and
a charge supply procedure in which a charge supply unit supplies another of the positive charge or the negative charge when the predetermined period elapses.

* * * * *